(12) United States Patent
Liu

(10) Patent No.: US 11,276,733 B2
(45) Date of Patent: Mar. 15, 2022

(54) ARRAYS OF MEMORY CELLS AND METHODS OF FORMING AN ARRAY OF VERTICALLY STACKED TIERS OF MEMORY CELLS

(71) Applicant: Micron Technology, Inc., Boise, ID (US)

(72) Inventor: Zengtao T. Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/283,645

(22) Filed: Feb. 22, 2019

(65) Prior Publication Data

US 2019/0189689 A1 Jun. 20, 2019

Related U.S. Application Data

(62) Division of application No. 14/594,813, filed on Jan. 12, 2015, now Pat. No. 10,256,275, which is a
(Continued)

(51) Int. Cl.
*H01L 27/24* (2006.01)
*H01L 45/00* (2006.01)

(52) U.S. Cl.
CPC ........ *H01L 27/249* (2013.01); *H01L 27/2436* (2013.01); *H01L 45/06* (2013.01); *H01L 45/1226* (2013.01); *H01L 45/1253* (2013.01); *H01L 45/1675* (2013.01); *H01L 45/1683* (2013.01); *H01L 45/04* (2013.01);
(Continued)

(58) Field of Classification Search
CPC .......................... H01L 45/1226; H01L 27/249
See application file for complete search history.

(56) References Cited

U.S. PATENT DOCUMENTS 5,068,603 A 11/1991 Mahoney
5,206,183 A 4/1993 Dennison
(Continued)

OTHER PUBLICATIONS

Yoon et al., "Vertical Cross-Point Resistance Change Memory for Ultra-High Density Non-Volatile Memory Applications", Symposium on VLSI Technology Digest of Technical Papers, 2009, United States. pp. 26-27.

*Primary Examiner* — Kevin Parendo
(74) *Attorney, Agent, or Firm* — Wells St. John P.S.

(57) ABSTRACT

An array of vertically stacked tiers of memory cells includes a plurality of horizontally oriented access lines within individual tiers of memory cells and a plurality of horizontally oriented global sense lines elevationally outward of the tiers. A plurality of select transistors is elevationally inward of the tiers. A plurality of pairs of local first and second vertical lines extends through the tiers. The local first vertical line within individual of the pairs is in conductive connection with one of the global sense lines and in conductive connection with one of the two source/drain regions of one of the select transistors. The local second vertical line within individual of the pairs is in conductive connection with another of the two source/drain regions of the one select transistor. Individual of the memory cells include a crossing one of the local second vertical lines and one of the horizontal access lines and programmable material therebetween. Other aspects and implementations, including methods, are disclosed.

9 Claims, 21 Drawing Sheets

Related U.S. Application Data division of application No. 13/074,642, filed on Mar. 29, 2011, now Pat. No. 8,933,491.

(52) U.S. Cl.
CPC ............ *H01L 45/08* (2013.01); *H01L 45/085* (2013.01); *H01L 45/14* (2013.01); *H01L 45/142* (2013.01); *H01L 45/143* (2013.01); *H01L 45/144* (2013.01); *H01L 45/146* (2013.01); *H01L 45/147* (2013.01)

(56) References Cited

U.S. PATENT DOCUMENTS

| | | | |
|---|---|---|---|
| 7,838,360 | B2 | 11/2010 | Forbes |
| 2001/0053576 | A1 | 12/2001 | Noble |
| 2004/0151024 | A1 | 8/2004 | Fricke et al. |
| 2007/0018630 | A1 | 1/2007 | Oehm |
| 2008/0123392 | A1 | 5/2008 | Kinoshita |
| 2008/0265235 | A1* | 10/2008 | Kamigaichi ........ H01L 27/2409 257/2 |
| 2008/0310209 | A1 | 12/2008 | Liu et al. |
| 2009/0168495 | A1 | 7/2009 | Aoki |
| 2009/0179184 | A1* | 7/2009 | Liu ..................... H01L 45/1226 257/2 |
| 2009/0230512 | A1 | 9/2009 | Baek et al. |
| 2009/0279343 | A1* | 11/2009 | Chang ................. H01L 45/1633 365/148 |
| 2009/0298252 | A1* | 12/2009 | Meijer ................. H01L 45/147 438/382 |
| 2009/0302301 | A1* | 12/2009 | Hwang ............... H01L 45/1233 257/4 |
| 2010/0008124 | A1 | 1/2010 | Scheuerlein et al. |
| 2010/0052030 | A1 | 3/2010 | Sakaguchi et al. |
| 2010/0065836 | A1* | 3/2010 | Lee ...................... H01L 45/146 257/43 |
| 2010/0097859 | A1 | 4/2010 | Shim et al. |
| 2010/0188894 | A1 | 7/2010 | Rao et al. |
| 2010/0238707 | A1 | 9/2010 | Tsuchida |
| 2010/0270529 | A1* | 10/2010 | Lung ................. G11C 13/0023 257/4 |
| 2010/0295134 | A1 | 11/2010 | Nagashima et al. |
| 2011/0216603 | A1 | 9/2011 | Han et al. |
| 2012/0086054 | A1* | 4/2012 | Cheng ................. H01L 29/7833 257/288 |

* cited by examiner

ARRAYS OF MEMORY CELLS AND METHODS OF FORMING AN ARRAY OF VERTICALLY STACKED TIERS OF MEMORY CELLS

RELATED PATENT DATA

This patent resulted from a divisional of U.S. patent application Ser. No. 14/594,813 filed Jan. 12, 2015, which is a divisional of U.S. patent application Ser. No. 13/074,642 which was filed Mar. 29, 2011, each of which is incorporated by reference herein.

TECHNICAL FIELD

Embodiments disclosed herein pertain to arrays of memory cells and to methods of forming an array of vertically stacked tiers of memory cells.

BACKGROUND

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two current conductive electrodes having a programmable material there-between. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

Some programmable materials may contain mobile charge carriers larger than electrons and holes, for example ions in some example applications. Regardless, the programmable materials may be converted from one memory state to another by moving the mobile charge carriers to alter a distribution of charge density within the programmable materials. Some example memory devices that utilize ions as mobile charge carriers are resistive RAM (RRAM) cells, which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between first a memory state in which charge density is relatively uniformly dispersed throughout the material and a second memory state in which the charge density is concentrated in a specific region of the material (for instance, a region closer to one electrode than the other).

A PMC may similarly have programmable material sandwiched between a pair of current conductive electrodes. The PMC programmable material comprises ion conductive material, for example a suitable chalcogenide or any of various suitable oxides. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across the electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

DETAILED DESCRIPTION OF EXAMPLE EMBODIMENTS

Embodiments of the invention include arrays of memory cells independent of method of fabrication, and methods of forming an array of vertically stacked tiers of memory cells. The memory cells may be nonvolatile. Initial example arrays are described with reference to FIGS. 1-3 and a substrate fragment 10 comprising a suitable base substrate 12 over which various materials have been provided. Base substrate 12 may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias formed therein which extend vertically or otherwise into current conductive electrical connection with electronic device components, regions, or material elevationally inward of the dielectric material. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three-dimensional space. Further in this document, "elevational" and "elevationally" are referenced to the vertical direction from a base substrate upon which the circuitry is fabricated.

The base substrate may or may not be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
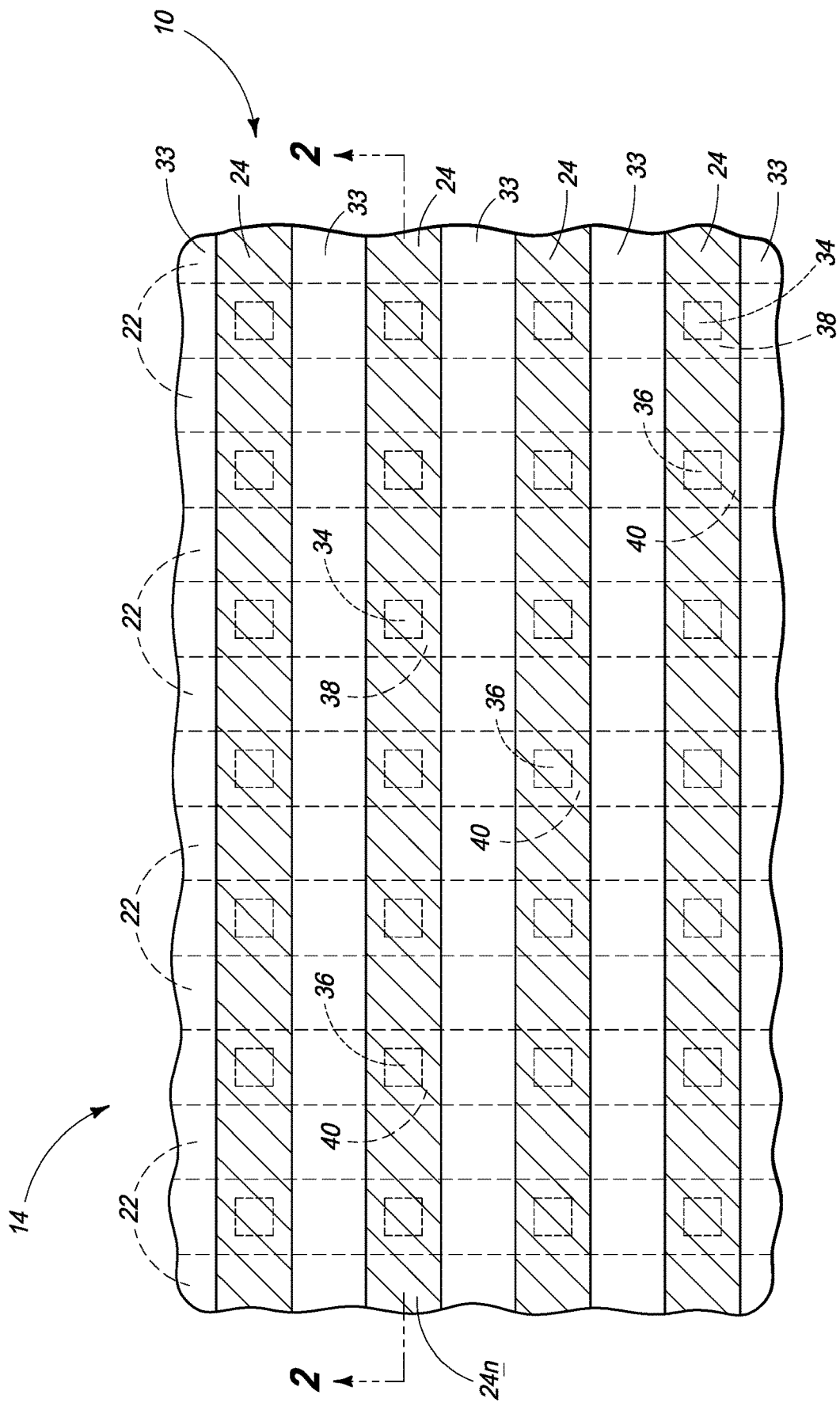
FIG. 1 is a diagrammatic top plan view of a substrate in accordance with an embodiment of the invention.
Figure 2:
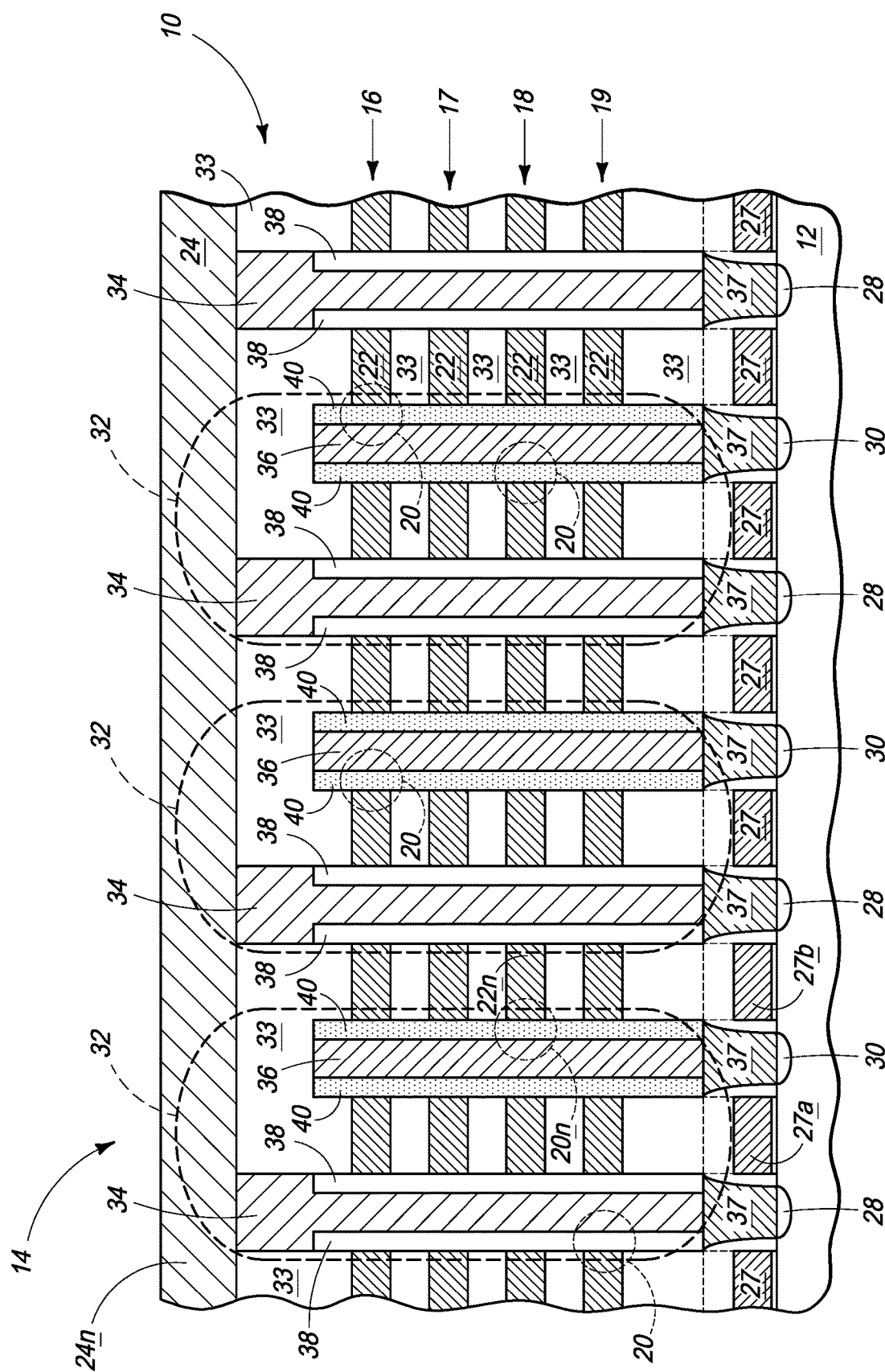
FIG. 2 is a diagrammatic cross sectional view taken through line 2-2 in FIG. 1.
Figure 3:
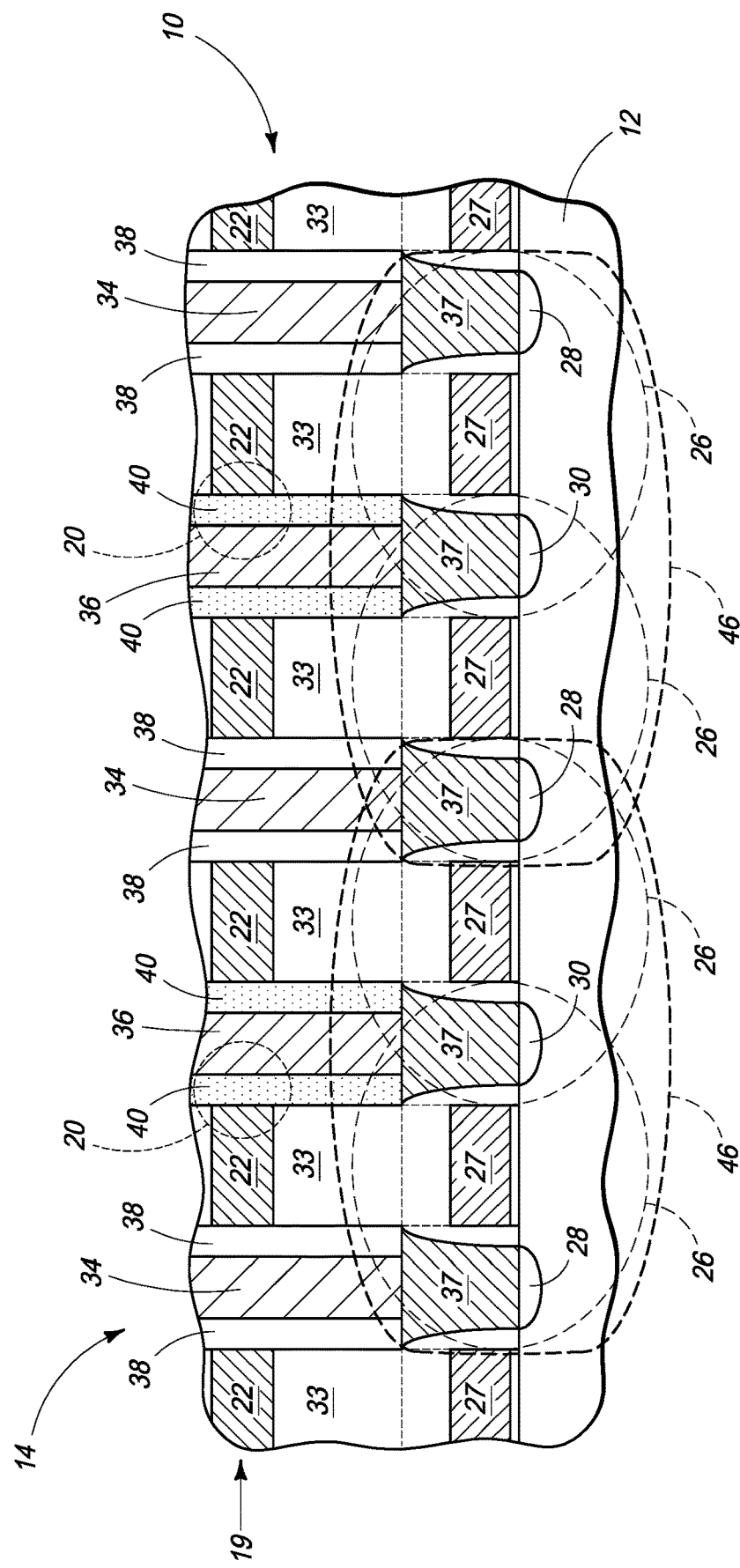
FIG. 3 is an enlargement of a portion of FIG. 2.

FIGS. 1-3 show an array 14 of vertically stacked tiers 16, 17, 18, 19 of memory cells 20. Logic circuitry (not shown) may be fabricated outside of the array area. Control and/or other peripheral circuitry (not shown) for operating the memory array may or may not fully or partially be within the array area, with an example array area as a minimum encompassing all of the memory cells of a given array/sub-array. Further, multiple sub-arrays might also be fabricated and operated independently, in tandem, or otherwise relative one another. As used in this document, a "sub-array" may also be considered as an array.

FIG. 2 shows four vertically stacked tiers 16-19 of individual memory cells 20. One or more tiers may be elevationally outward of tier 16 and/or elevationally inward of tier 19. Further, fewer than four tiers may be fabricated. Vertical tiers 16-19 may be of the same or different respective construction(s). In one embodiment, all of such are of the same construction, for example to achieve an ultimate highest density and/or for ease in fabrication.

Array 14 includes a plurality of horizontally oriented access lines 22 (i.e., word lines) within the individual tiers of memory cells. Lines 22 may comprise current conductive material, and may be homogenous or non-homogenous. In the context of this document, "current conductive material" is a composition wherein electric current flow would inherently occur therein predominantly by movement of subatomic positive and/or negative charges when such are generated as opposed to predominantly by movement of ions. Example current conductive materials are elemental metals, alloys of elemental metals, current conductive metal compounds, and conductively doped semiconductive material, including any combinations thereof. A plurality of horizontally oriented global sense lines 24 (i.e., bit lines) are elevationally outward of the tiers of memory cells. Sense lines 24 may comprise current conductive material, and may be homogenous or non-homogenous. Such may be of the same or different composition as that of access lines 22, with example materials being as described above. One or more dielectric materials 33 may be provided between certain current conductive materials as shown.

In one embodiment, lines 22 and 24 cross orthogonally relative one another, although such may cross non-orthogonally. Further in the depicted example, each of lines 22 and 24 extend longitudinally straight linear. Alternately by way of examples only, some or all of lines 22 and 24 may not be straight linear, for example being longitudinally curvilinear (not shown) regardless of whether crossing orthogonally relative one another.

A plurality of select transistors 26 (FIG. 3) is elevationally inward of the tiers of memory cells. Individual of select transistors 26 comprise a gate 27 and gate dielectric immediately there-beneath over base substrate 12. In some embodiments, gates of certain adjacent select transistors may be wired together in parallel, for example as described further below. Individual of select transistors 26 also include two source/drain regions 28, 30 within semiconductive material of base substrate 12. Base substrate 12 comprises semiconductive material between source/drain regions 28, 30 capable of functioning as a switchable transistor channel region. Insulative sidewall spacers and insulative caps are over gates 27.

Array 10 includes a plurality of pairs 32 (FIG. 2) of local first vertical lines 34 and second vertical lines 36 extending through the tiers of memory cells. Local first vertical lines 34 within individual of pairs 32 are in conductive connection with one of global sense lines 24 and in conductive connection with one of the two source/drain regions of one of the select transistors 26. Local second vertical lines 36 within individual of pairs 32 are in conductive connection with another of the two source/drain regions of the one select transistor 26. Local first and second vertical lines 34, 36 may comprise current conductive material, and may be homogenous or non-homogenous. Such may be of the same or different composition(s), with the example current conductive materials described above being examples. Current conductive material 37 may comprise local first and second vertical lines 34, 36, respectively, or otherwise be provided between local first and second vertical lines 34, 36 and the source/drain regions 28, 30, respectively.

In one embodiment, local first vertical lines 34 are taller than local second vertical lines 36. In one embodiment, local first vertical lines 34 are laterally lined with dielectric material 38.

In one embodiment, local second vertical lines 36 are laterally lined with programmable material 40. Regardless, programmable material 40 may be solid, gel, amorphous, crystalline, or any other suitable phase. Any programmable material may be used, with only some examples being provided below.

One example programmable material is ion conductive material. Example suitable such materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and $CuTe$) and/or oxides such as zirconium oxide, hafnium oxide, tungsten oxide, copper oxide, niobium oxide, iron oxide, silicon oxide (specifically, silicon dioxide), gadolinium oxide, etc. capable of inherently (or with additive) supporting electrolyte behavior. Such may have silver, copper, cobalt, and/or nickel ions, and/or other suitable ions, diffused therein for ionic conduction, analogously to structures disclosed in U.S. Pat. No. 7,405,967 and U.S. Patent Publication Number 2010/0193758.

Additional example programmable materials include multi-resistive state metal oxide-comprising material. Such may comprise, for example, at least two different layers or regions generally regarded as or understood to be active or passive regions, although not necessarily. Alternately, such may only comprise active material. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $SrZrO_3$, $BaTiO_3$, $Ba_{(1-x)}Sr_x$-$TiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, a programmable material composite might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others as long as resistance of the metal oxide-comprising material can be selectively changed.

The programmable material may comprise memristive material. As an example, such material may be statically programmable semiconductive material which comprises mobile dopants that are within a dielectric such that the material is statically programmable between at least two different resistance states. At least one of the states includes localization or gathering of the mobile dopants such that a dielectric region is formed and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$. Example programmable materials that comprise oxygen vacancies as mobile dopants may comprise a combination of $TiO_2$ and $TiO_{2-x}$ in at least one programmed resistance state depending on location of the oxygen vacancies and the quantity of the oxygen vacancies in the locations where such are received. An example programmable material that comprises nitrogen vacancies as mobile dopants is a combination of AlN and $AlN_{1-x}$ in at least one programmed state depending on location of the nitrogen vacancies and the quantity of the nitrogen vacancies in the locations where such are received. An example programmable material that comprises fluorine vacancies as mobile dopants may is a combination of $MgF_2$ and $MgF_{2-x}$ in at least one programmed resistance state depending on location of the fluorine vacancies and the quantity of the fluorine vacancies in the locations where such are received. As another example, the mobile dopants may comprise aluminum atom interstitials in a nitrogen-containing material.

Still other example programmable materials include polymer materials such as Bengala Rose, $AlQ_3Ag$, Cu-TCNQ, DDQ, TAPA, and fluorescine-based polymers.

Individual of memory cells 20 comprise a crossing of local second vertical lines 36 and one of horizontal access lines 22, and programmable material 40 there-between. While programmable material 40 is shown as being a continuous lining about local second vertical lines 36, such may be discontinuous and/or only provided laterally between the respective horizontally oriented access lines 22 and local second vertical lines 36 in some embodiments.

In one embodiment, an array of vertically stacked tiers of memory cells comprises a plurality of horizontally oriented access lines within individual tiers of memory cells. The array also comprises a plurality of horizontally oriented global sense lines independent of whether such are elevationally outward of the tiers of memory cells. In one implementation, such global sense lines are elevationally outward of the tiers of memory cells. The array also comprises a plurality of pairs of adjacent select transistors independent of whether such are elevationally inward of the tiers of memory cells. In one implementation, such select transistors are elevationally inward of the tiers of memory cells. By way of example only with respect to the FIGS. 1-3 embodiment, an example of plurality of pairs 46 (FIG. 3) of immediately adjacent select transistors 26 is shown. The pairs individually comprise a shared mid-source drain region 30 and two laterally outer source/drain regions 28.

The array of such embodiment also includes a plurality of alternating first and second local vertical lines independent of whether the local first vertical lines extend through the tiers of memory cells. In one implementation, the local first vertical lines extend through the tiers of memory cells. Regardless, the local first vertical lines are in conductive connection with one of the global sense lines and in conductive connection with one of the laterally outer source/drain regions. The local second vertical lines extend through the tiers of memory cells and are in conductive connection with one of the shared source/drain regions. Individual of the memory cells comprise a crossing of the local second vertical lines and one of the horizontal access lines, and include programmable material there-between. The FIGS. 1-3 embodiment is but one example.

The adjacent select transistors within an individual pair of select transistors may have their gates wired together in parallel. For example, such may be hard-wired together or soft-wired together. In the context of this document, gates are hard-wired together if a permanent conductive connection exists between such gates. Gates are soft-wired together if no permanent conductive connection exists between such gates, but such may be selectively placed into conductive connection with one another via software control. Regardless, in one embodiment, the laterally outer source/drain regions and local first vertical lines are shared by immediately adjacent of such pairs of adjacent select transistors. FIGS. 1-3 show but one example.

An embodiment of the invention encompasses an array of memory cells independent of whether such include vertically stacked tiers. In one implementation, the memory cells are arranged in vertically stacked tiers. Regardless, the array includes a plurality of crossing access lines and sense lines. Programmable material is between the crossing access and sense lines. The array includes two select transistors having respective gates that are wired in parallel to selectively enable current flow in each sense line.

In one embodiment, the access lines are arranged in vertically stacked tiers individually comprising a plurality of access lines. In one embodiment, the sense lines comprise local lines within the array, and further comprise global lines within the array in switchable conductive connection with the local lines. For example with respect to the embodiment shown in FIGS. 2 and 3, second vertical lines 36, first vertical lines 34, and global lines 24 within array 10 constitute example sense lines in switchable conductive connection via select transistors 26. In one embodiment, the global lines may be elevationally outward of all of the access lines within the array. In one embodiment, the select transistors are elevationally inward of all the access lines within the array. Other attributes from the above first-described embodiments may be used.

The above describes but example embodiments of arrays in vertically stacked tiers of memory cells, although other arrays are contemplated.

By way of examples only, the below chart shows example relative voltages which may be used to write, read, and erase any given memory cell, specifically for the example depicted memory cell 20n in FIG. 2.

|  | Line 24n | Gates 27a & 27b | Line 22n |
| --- | --- | --- | --- |
| WRITE | 3 V | 5 V | 0 V |
| READ | 1 V | 3 V | 0 V |
| ERASE | 0 V | 3 V | 3 V |

Any of the above constructions may be fabricated in accordance with any technique(s). Regardless, embodiments of the invention encompass methods of forming an array of vertically stacked tiers of memory cells, for example as is next-described with reference to FIGS. 4-21.

Figure 4:
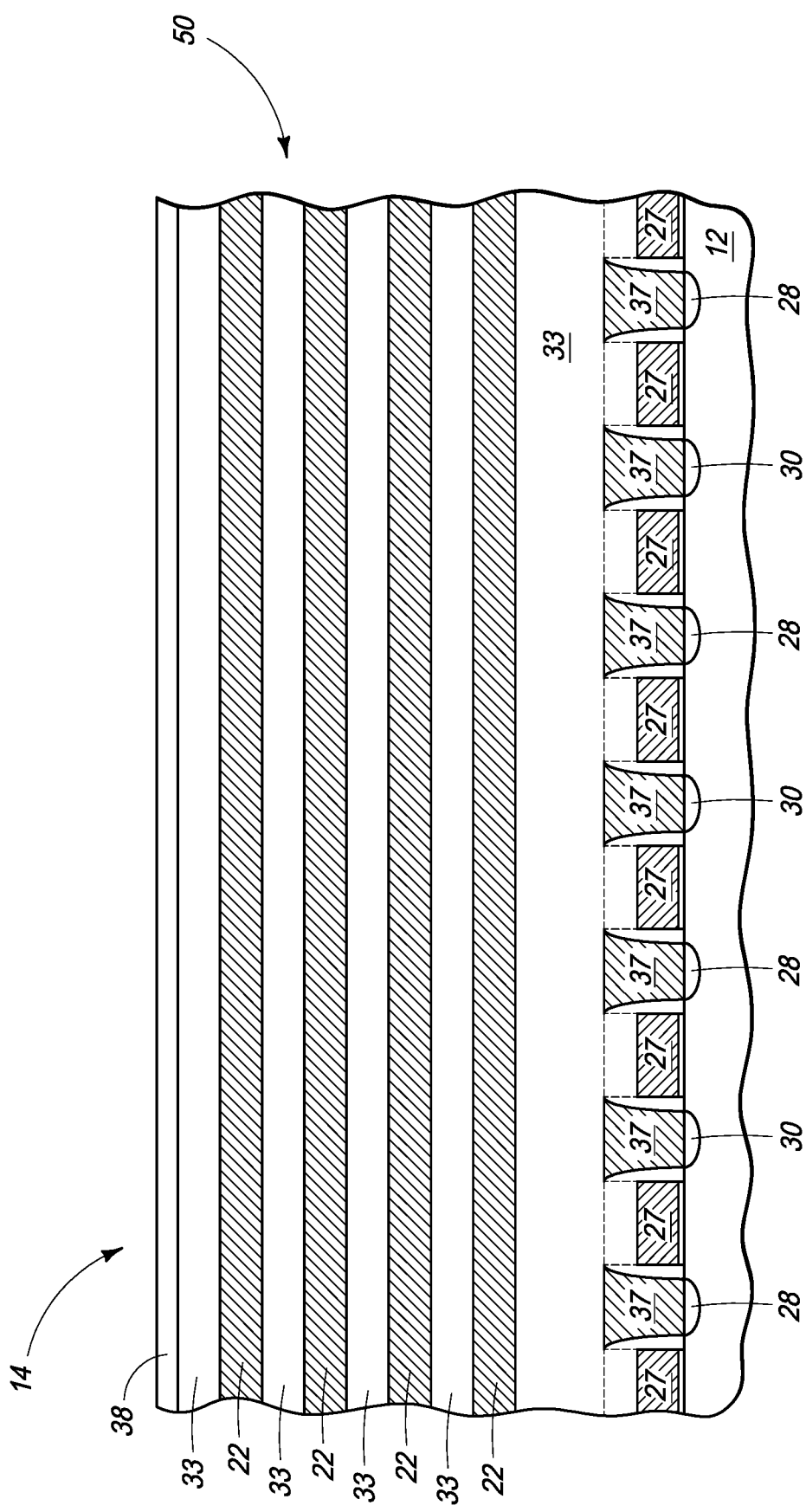
FIG. 4 is a diagrammatic sectional view of a substrate in process in accordance with an embodiment of the invention.

Referring to FIG. 4, a substrate fragment 50 is shown, for example in fabricating array 14 of FIGS. 1-3. Like numerals from FIGS. 1-3 have been used where appropriate, with some construction differences being indicated with the suffix "a" or with different numerals. Further, numerals of the components shown in FIGS. 1-3 have been used to designate the materials from which such components are fabricated prior to the materials necessarily being of the final example shapes for clarity in the drawings and ease of understanding in the description. FIG. 4 depicts select transistors 26 and alternating dielectric material 33 and access line material 22 formed thereover. An outer hardmask 38 has been provided over outermost material 33. Where, for example, material 33 comprises silicon dioxide, an example material 38 is silicon nitride. Regardless, materials 33 and 38 individually may be homogenous or non-homogenous.

Figure 5:
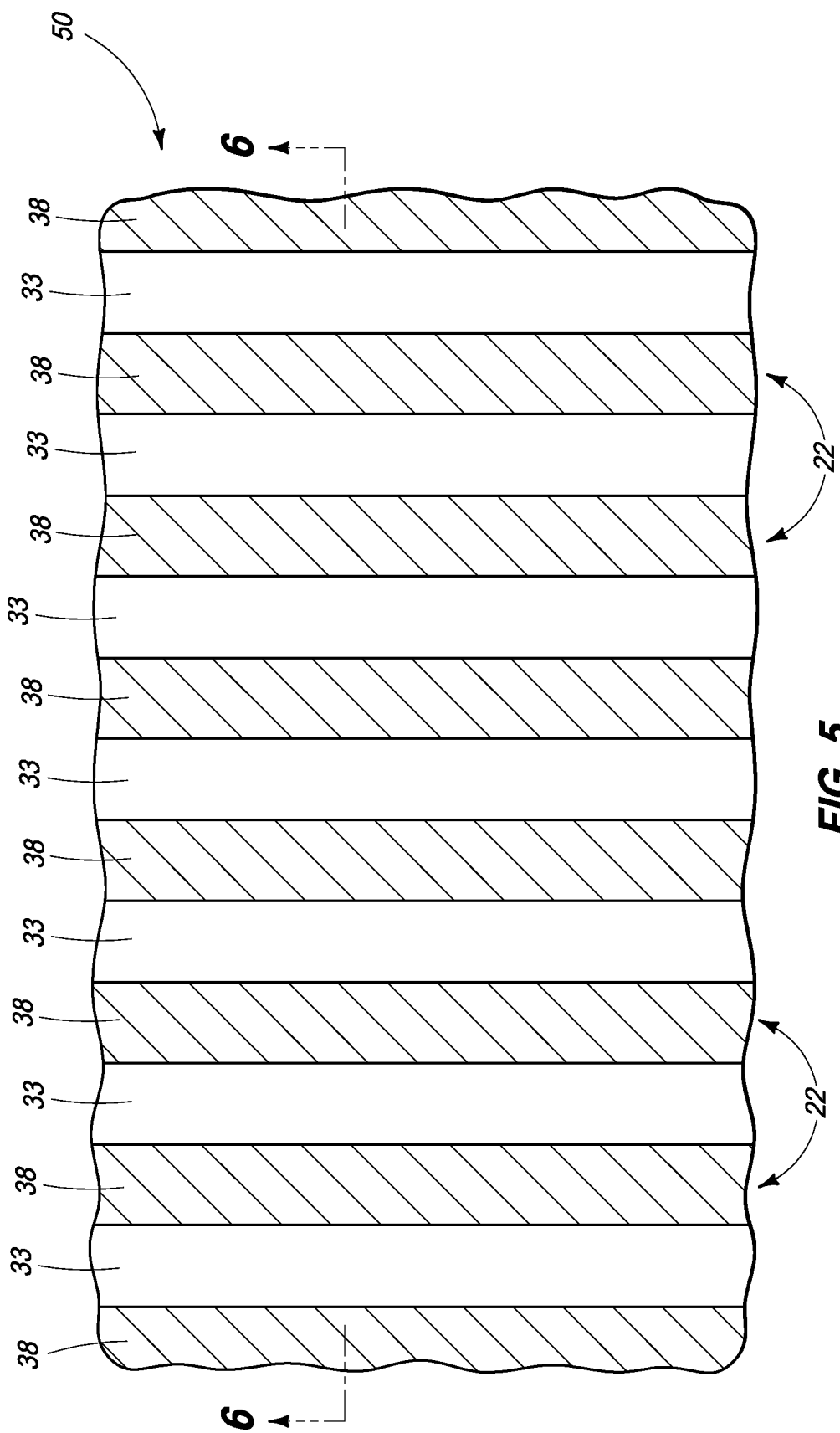
FIG. 5 is a diagrammatic top plan view of the substrate of FIG. 4 at a processing step subsequent to that shown by FIG. 4.
Figure 6:
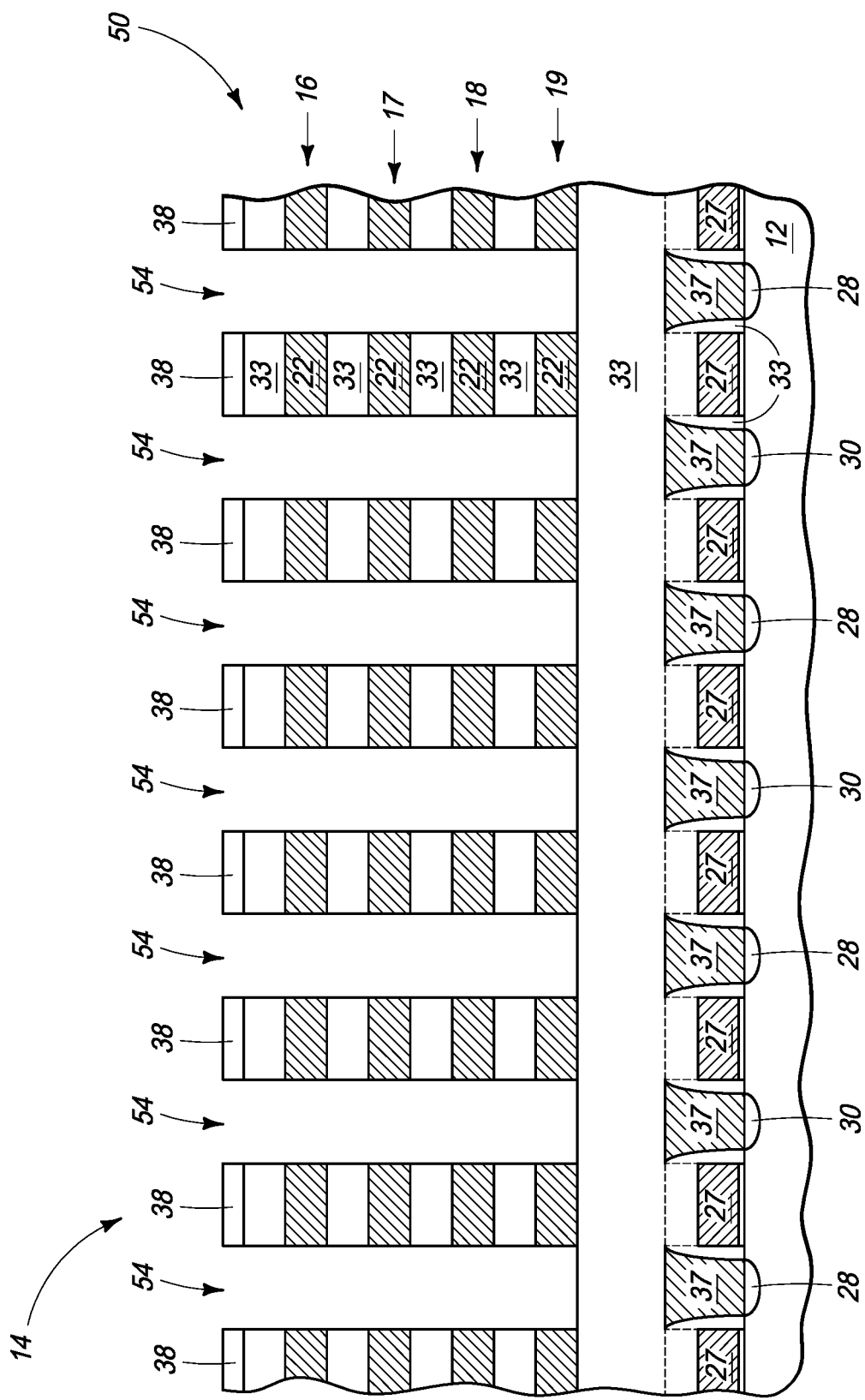
FIG. 6 is a cross sectional view taken through line 6-6 in FIG. 5.

Referring to FIGS. 5 and 6, multiple tiers 16, 17, 18 and 19 have been formed which individually comprise a plurality of horizontally oriented access lines 22. Such may be formed, by way of example, by patterning and etch to form trenches 54 as shown. Innermost dielectric region 33 may comprise an outermost etch stop material (not shown) to provide an etch-stopping function when innermost material 22 has been etched through.

Figure 7:
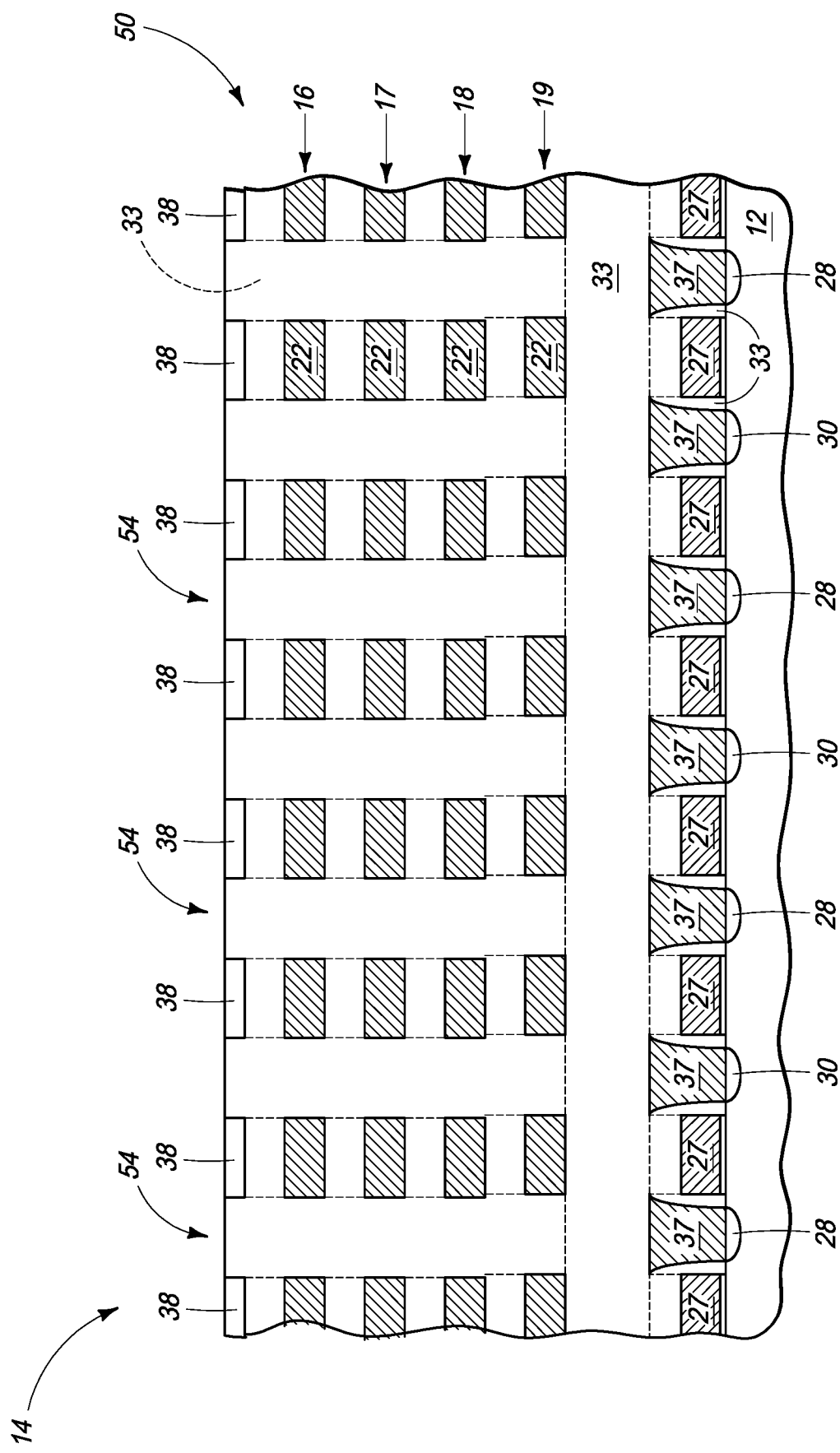
FIG. 7 is a view of the FIG. 6 substrate at a processing step subsequent to that shown by FIGS. 5 and 6.

Referring to FIG. 7, trenches 54 have been filled with dielectric material which has subsequently been planarized back at least to elevationally outermost surfaces of hardmask material 38. The dielectric material may be homogenous or non-homogenous and, in one embodiment, may be of the same composition as that of material 33 and is so shown and designated in the figures.

Figure 8:
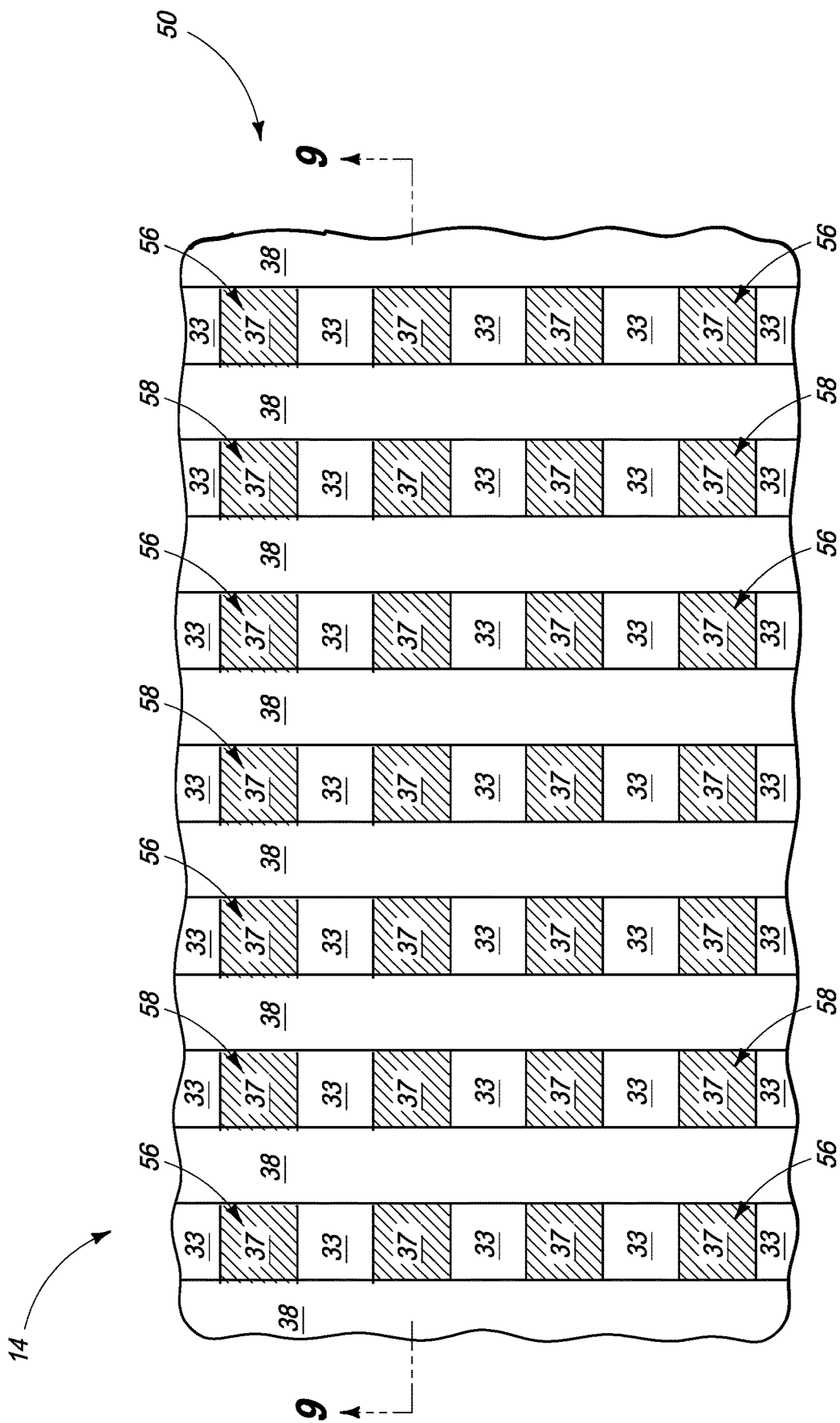
FIG. 8 is a top view of the substrate of FIG. 7 at a processing step subsequent to that shown by FIG. 7.
Figure 9:
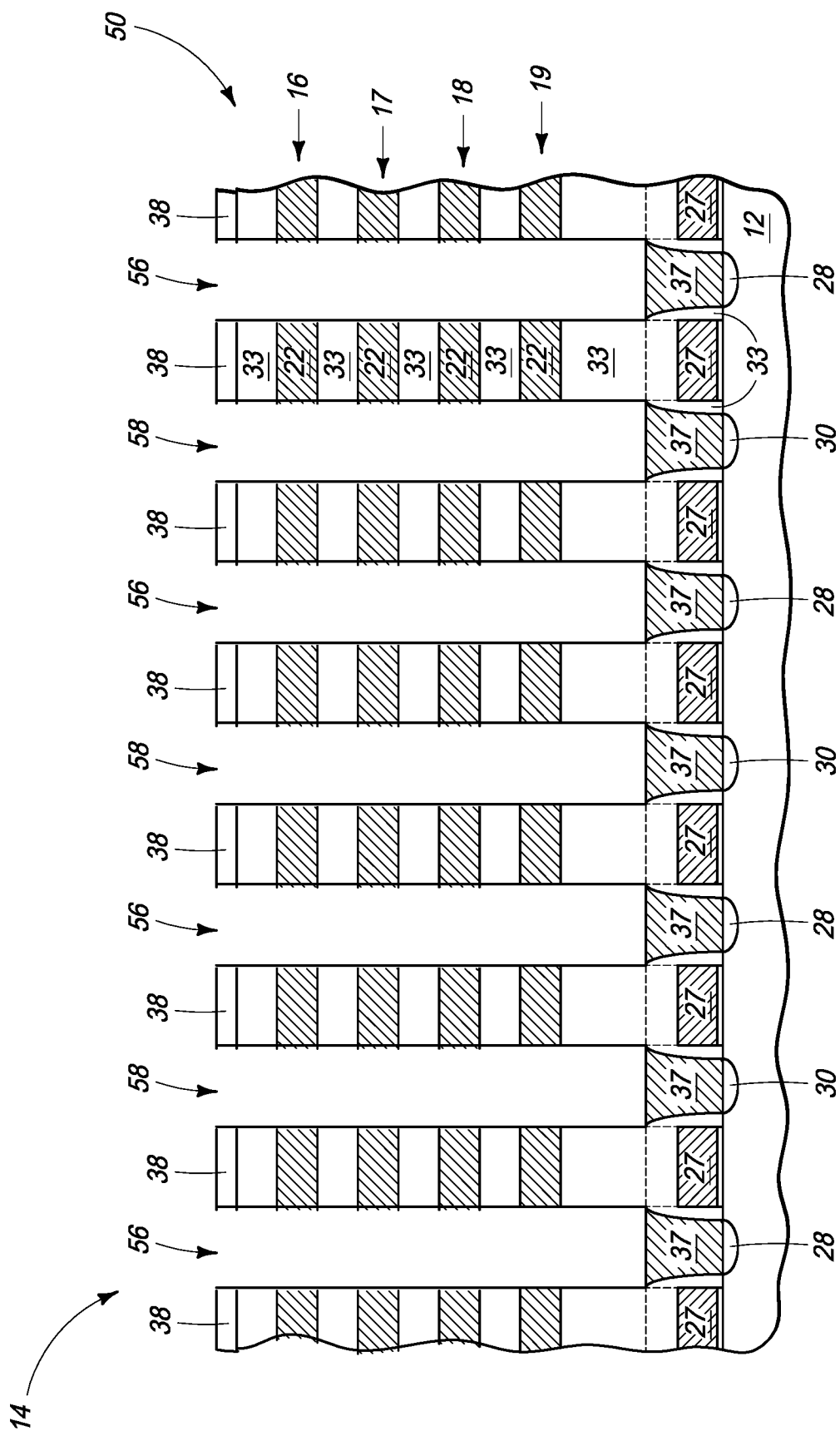
FIG. 9 is a cross sectional view taken through line 9-9 in FIG. 8.

Referring to FIGS. 8 and 9, alternating first and second local openings 56, 58, respectively, have been formed through tiers 16-19 between access lines 22 over individual of source/drain regions 28, 30. In one embodiment, first local openings 56 and second local openings 58 are formed using the same masking step. In one embodiment, individual openings 56, 58, respectively, may be formed in a self-aligning manner in opposing lateral directions relative to immediately laterally adjacent of access lines 22. For example and by way of example only, mask lines (not shown) could be formed orthogonally relative to access lines 22 with trenches formed there-between which overlie the respective openings 56, 58. Removal (i.e., by etching) of dielectric material 33 deposited in FIG. 7 may then occur selectively, and in one embodiment highly selectively, relative to the material of select lines 22, thereby self-aligning relative to such lines. In the context of this document, a "selective" etch requires removal of the stated one material relative to another at a rate of at least 1.5:1, and a highly selective etch at a rate of at least about 10:1. In the context of this document, a "self-aligning manner" means a technique whereby at least a lateral surface of a structure is defined by deposition of material against a sidewall of a previously patterned structure.

Figure 10:
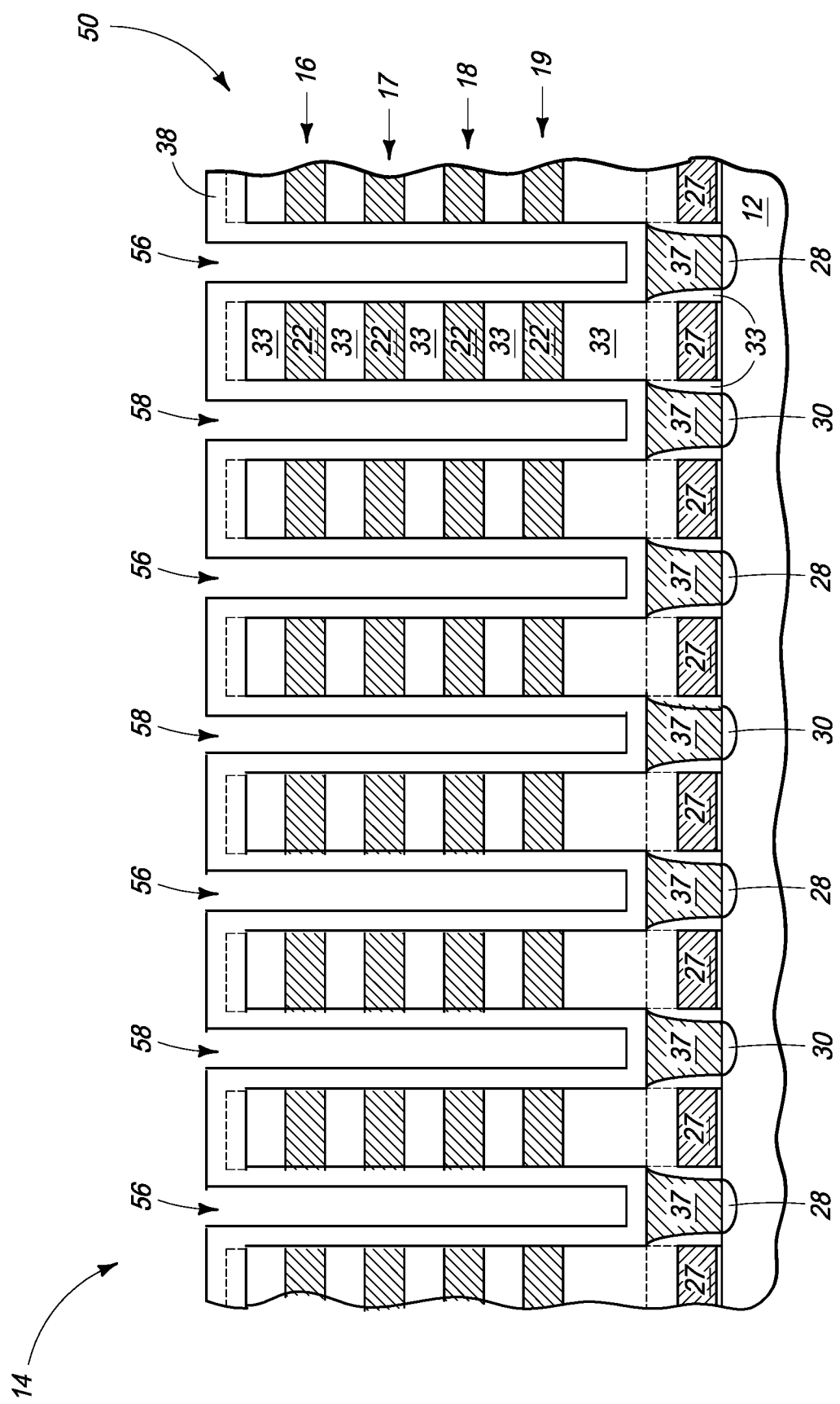
FIG. 10 is a view of the FIG. 9 substrate at a processing step subsequent to that shown by FIGS. 8 and 9.

Referring to FIG. 10, and in one embodiment, first local openings 56 and second local openings 58 have been lined with dielectric material. In one embodiment, the same dielectric material lines first local openings 56 and second local openings 58, and in such embodiment may be deposited into the openings at the same time. The dielectric material lining openings 56, 58 may be homogenous or non-homogenous. In one embodiment, the dielectric material may be of the same composition as that of hardmask material 38 and is so shown and designated in the figures. Regardless, hardmask material 38 may have been partially or wholly removed (not shown) earlier.

Figure 11:
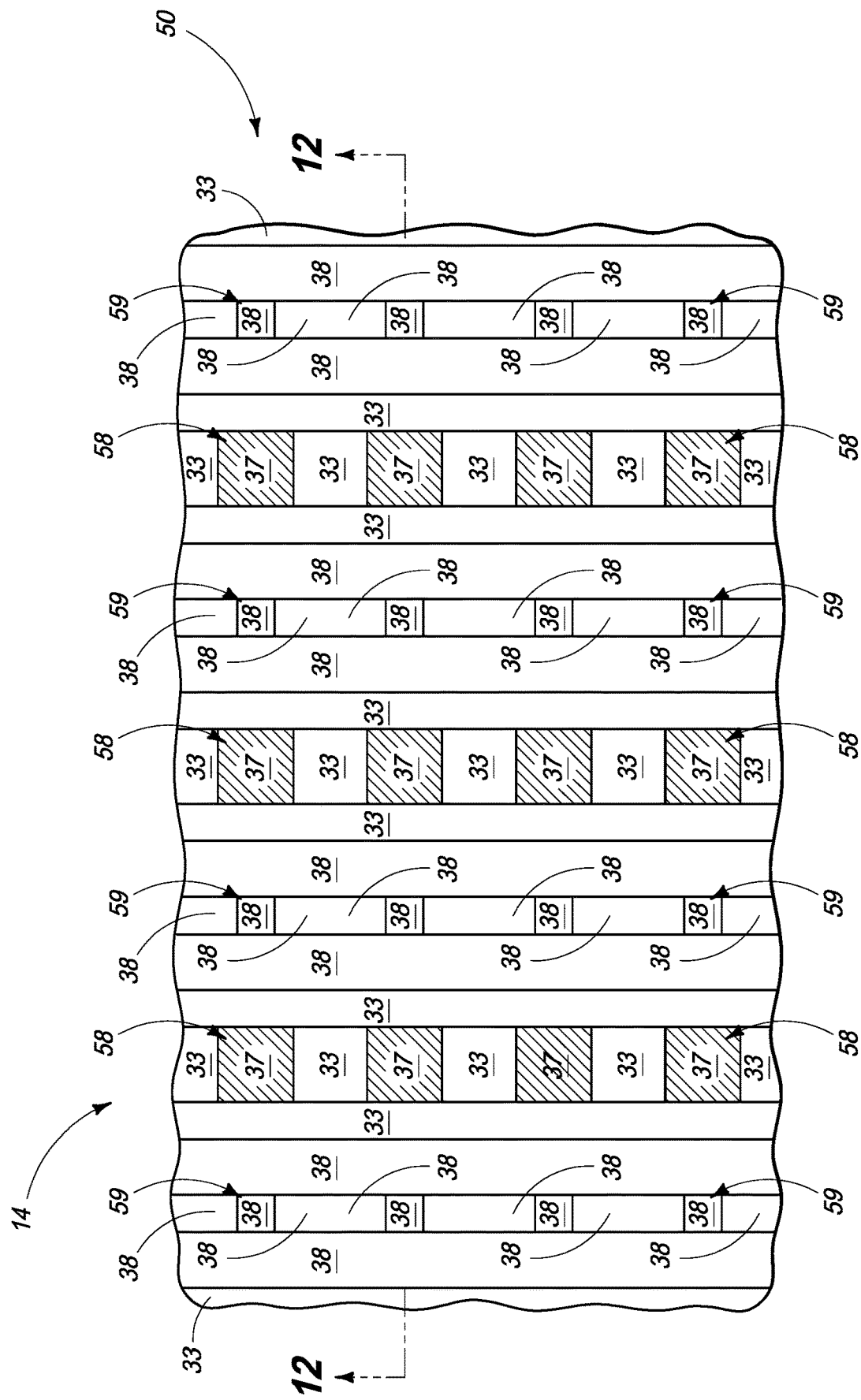
FIG. 11 is a top view of the substrate of FIG. 10 at a processing step subsequent to that shown by FIG. 10.
Figure 12:
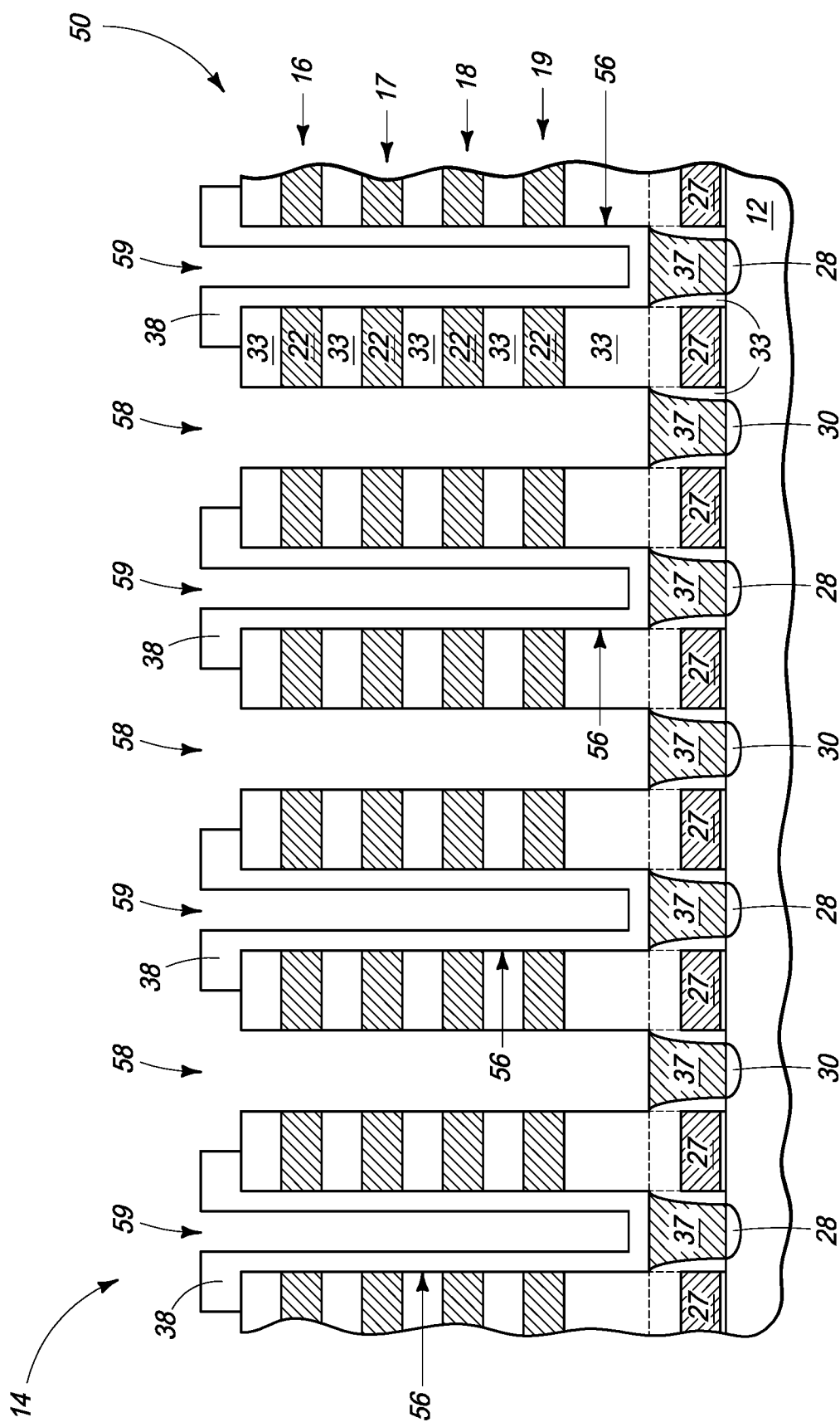
FIG. 12 is a cross sectional view taken through line 12-12 in FIG. 11.

Referring to FIGS. 11 and 12, a mask (not shown) has been formed over the substrate to cover material 38 within first openings 56 and to leave trench openings formed there-through over material 38 within second local openings 58 outwardly exposed. Using such mask, dielectric material 38 that was lining second local openings 58 has been removed. In one embodiment and as shown, all of dielectric material 38 that was lining second local openings 58 has been removed. In one embodiment, remaining volume of first openings 56 may be considered as first openings 59. Accordingly in one embodiment, processing through FIGS. 11 and 12 may be considered as the forming of alternating first and second local openings 59, 58, respectively.

Figure 13:
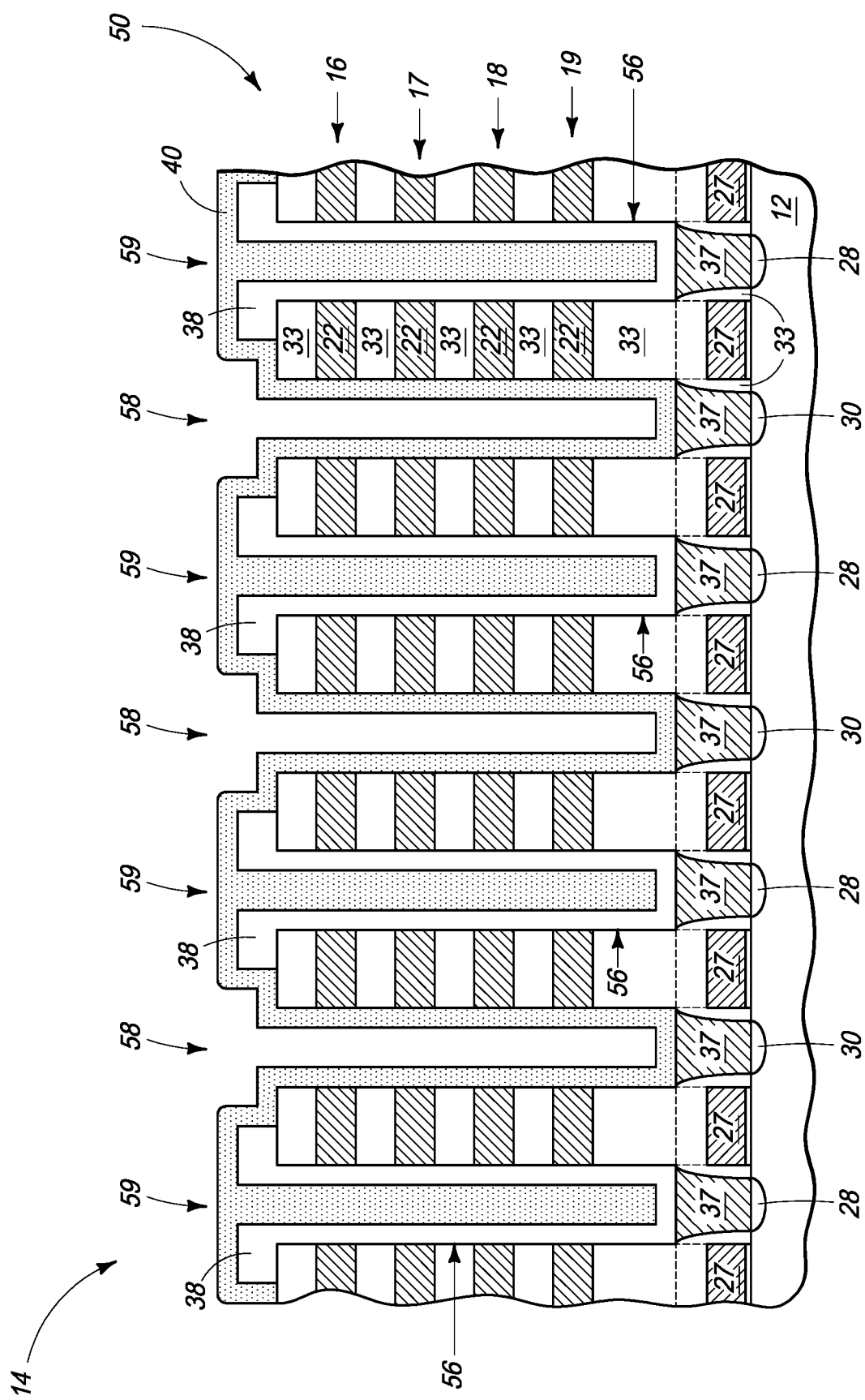
FIG. 13 is a view of the FIG. 12 substrate at a processing step subsequent to that shown by FIGS. 11 and 12.

Referring to FIG. 13, second local openings 58 have been lined with programmable material 40. In one embodiment and as shown, programmable material 40 is deposited to less-than-fill second local openings 58 and to fill first local openings 59. In one embodiment, such acts of filling and lining with programmable material 40 relative to first local openings 59 and second local openings 58 occur in the same deposition step. Regardless, FIG. 13 depicts but one example embodiment of replacing dielectric material 38 that was lining second local openings 58 with a programmable material lining 40.

Figure 14:
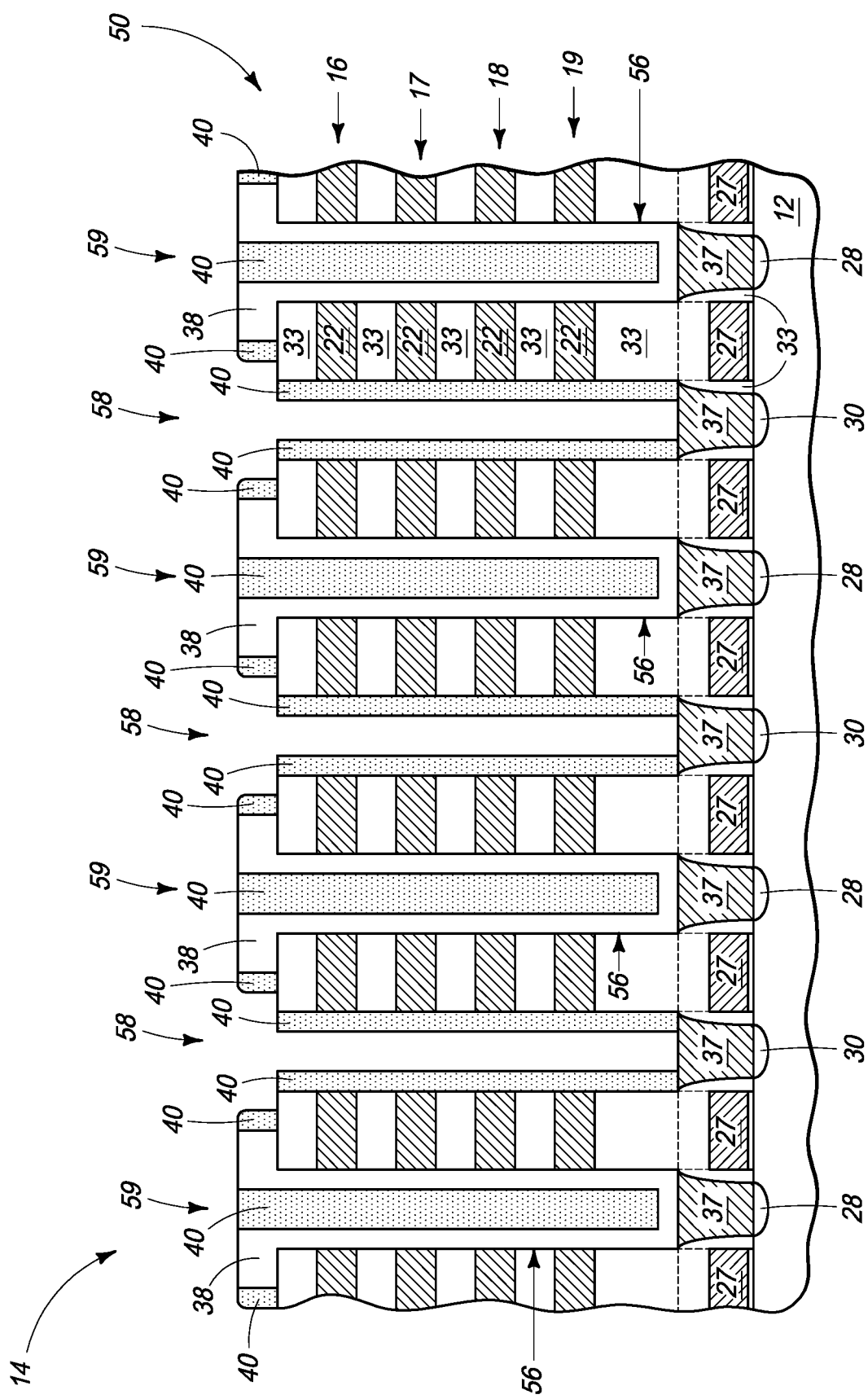
FIG. 14 is a view of the FIG. 13 substrate at a processing step subsequent to that shown by FIG. 13.

Referring to FIG. 14, programmable material 40 has been anisotropically etched to remove such from horizontal surfaces. Such may expose conductive material 37 which may be in conductive connection with source/drain regions 30.

Figure 15:
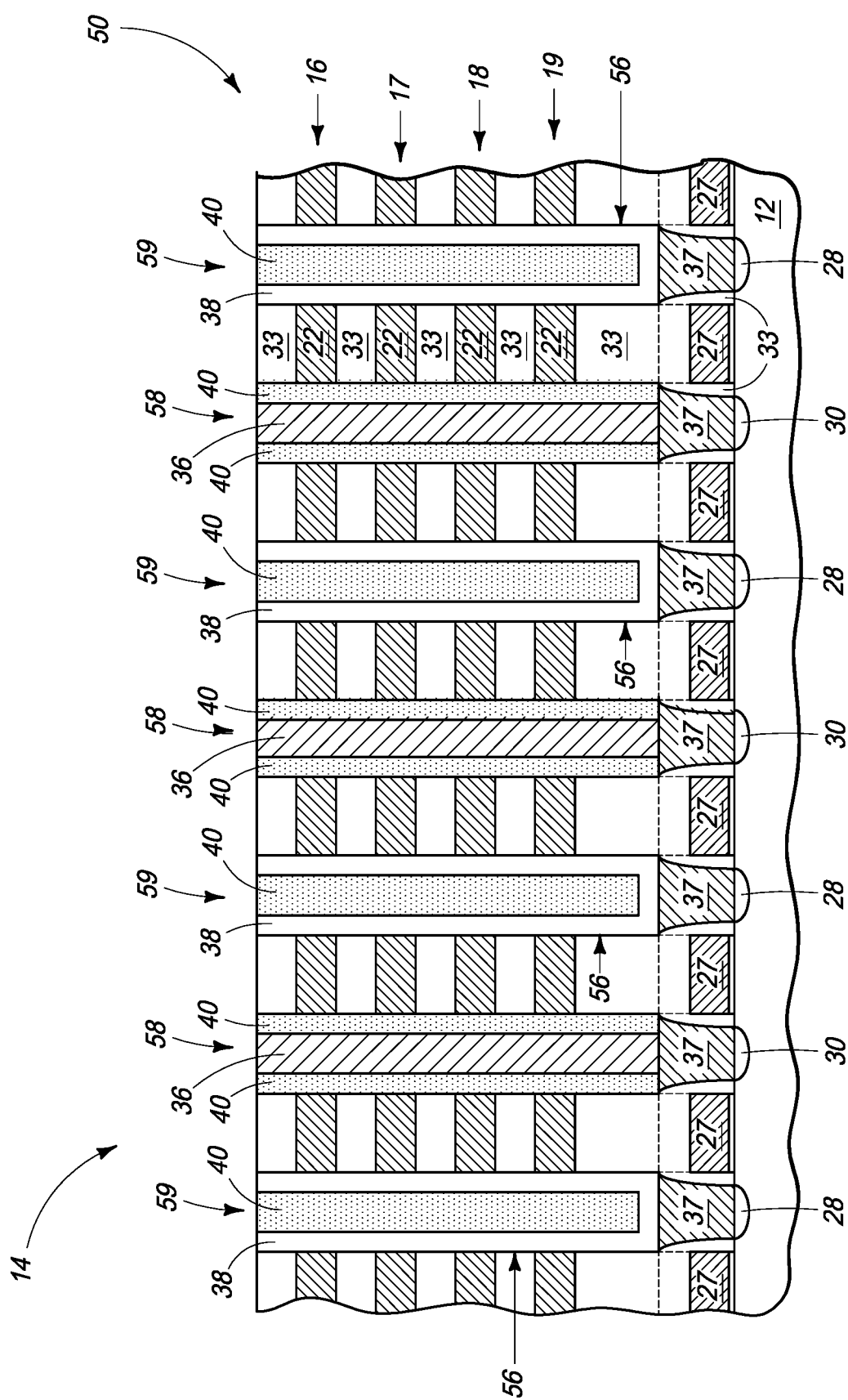
FIG. 15 is a view of the FIG. 14 substrate at a processing step subsequent to that shown by FIG. 14.

Referring to FIG. 15, conductive material 36 has been formed in second openings 58 in conductive connection with alternating source/drain regions 30. Such may be formed by deposition of conductive material 36 to a sufficient thickness to fill remaining volume of second local openings 58, followed by planarizing at least to the elevationally outermost surface of outer material 33, as shown. Programmable material 40 in second local openings 58 is laterally between conductive material 36 and access lines 22.

Figure 16:
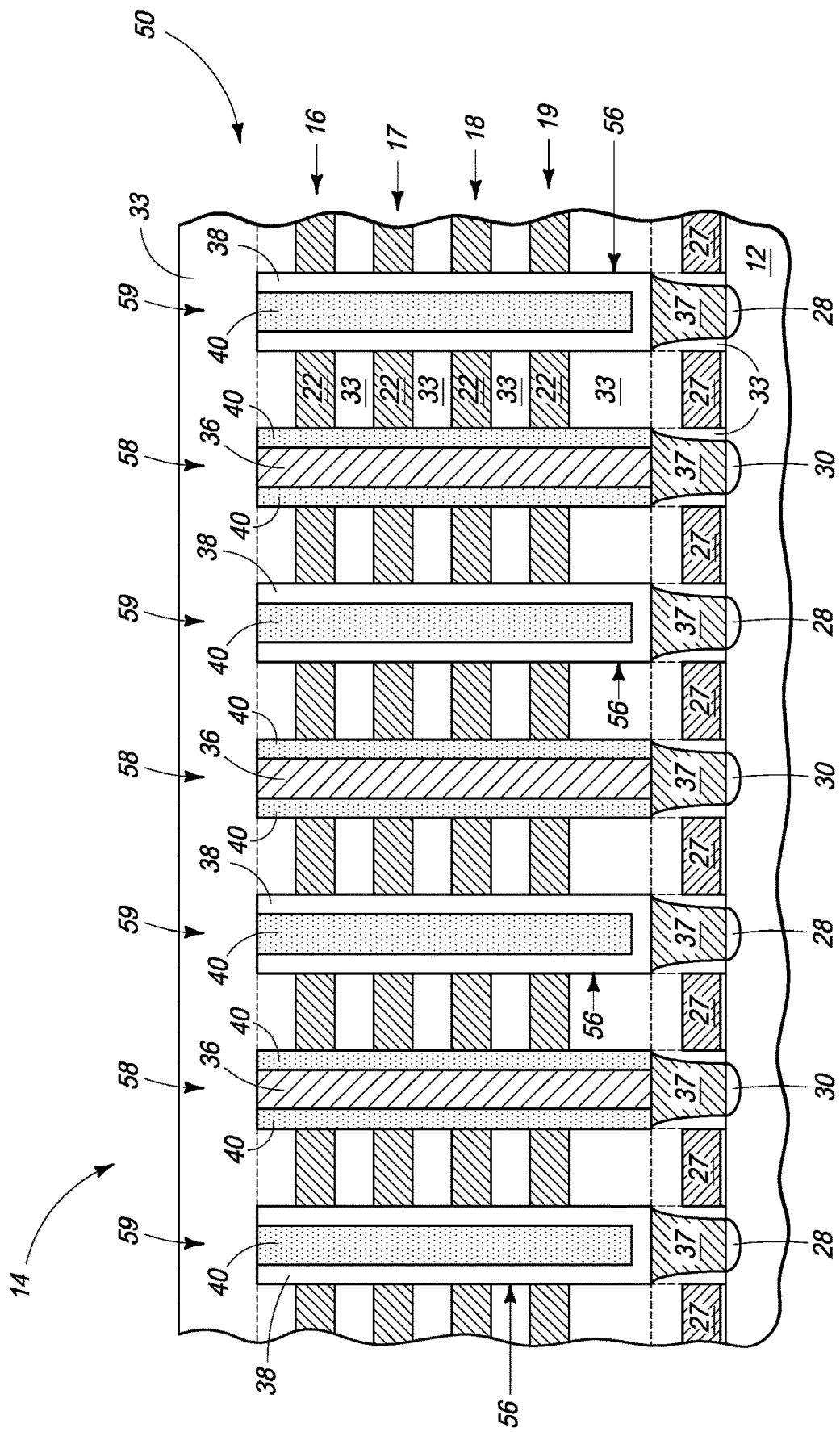
FIG. 16 is a view of the FIG. 15 substrate at a processing step subsequent to that shown by FIG. 15.

Referring to FIG. 16, dielectric material has been formed over and as part of substrate 50. Such may be homogenous or non-homogenous and, in one embodiment, may be of the same composition as that of material 33 and is so shown and designated in the figures.

Figure 17:
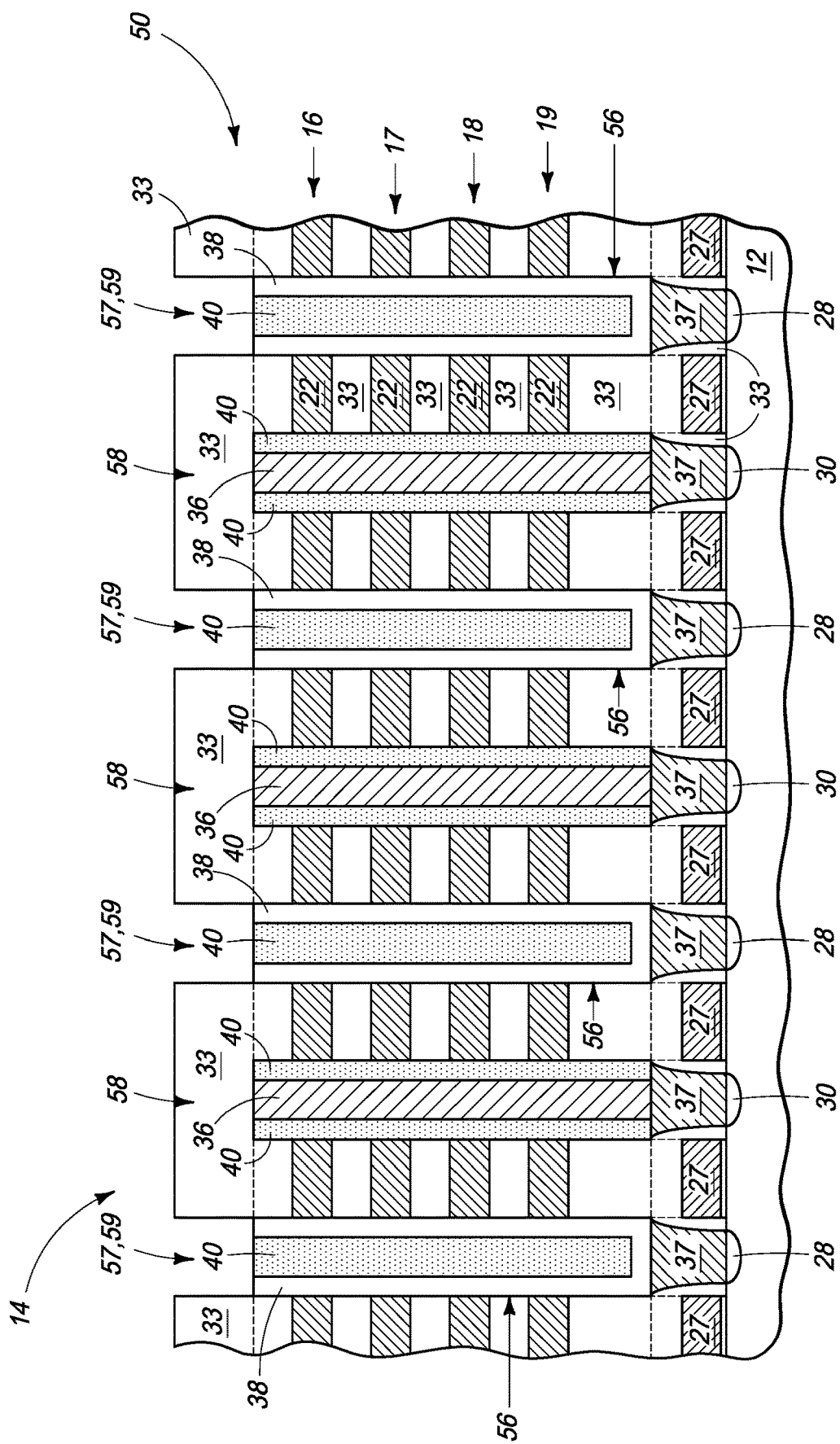
FIG. 17 is a view of the FIG. 16 substrate at a processing step subsequent to that shown by FIG. 16.

Referring to FIG. 17, substrate 50 has been patterned to form contact openings 57 through material 33 over at least programmable material 40 within first local openings 56, 59 and to leave such programmable material within second openings 58 masked.

Figure 18:
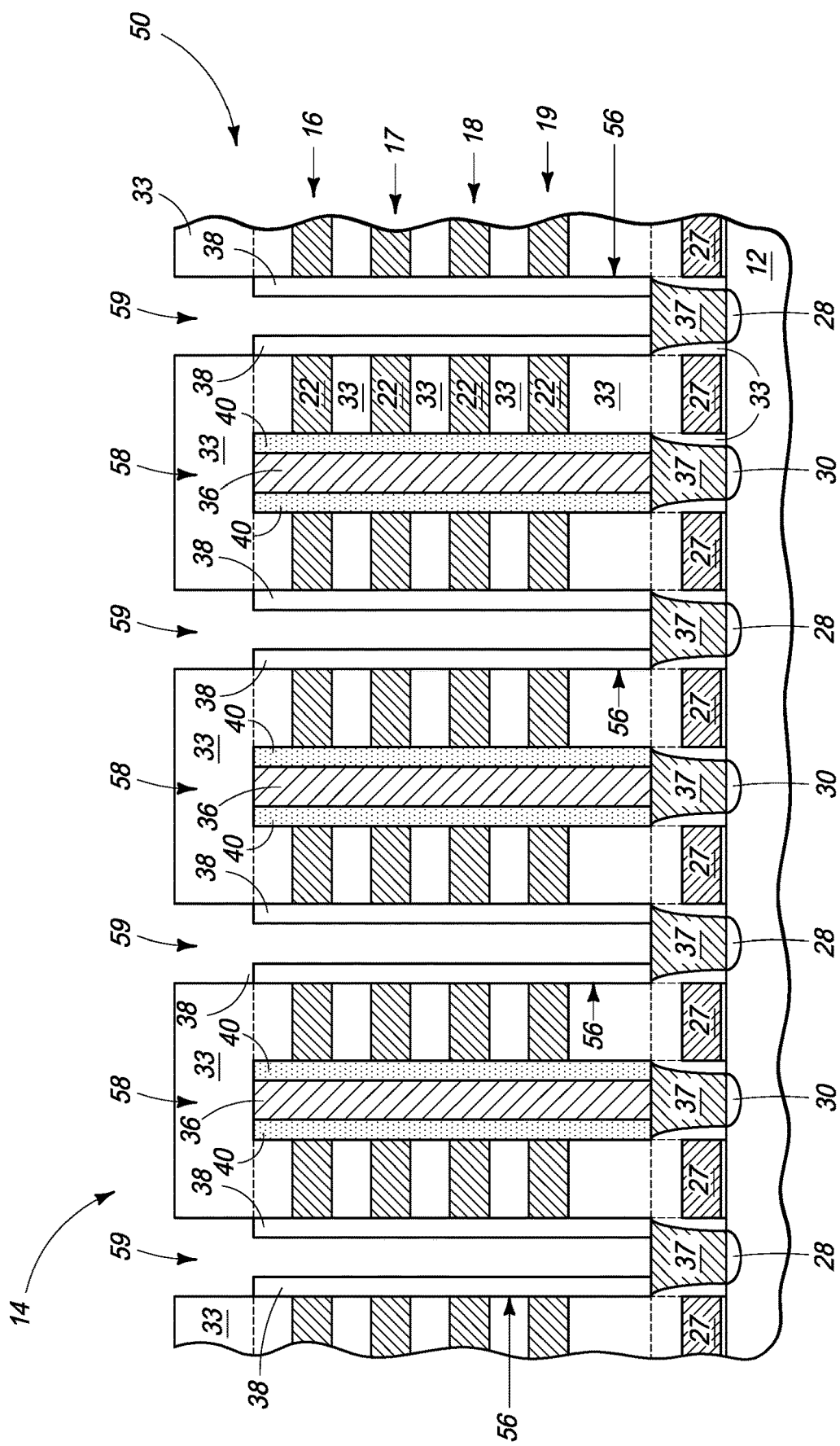
FIG. 18 is a view of the FIG. 17 substrate at a processing step subsequent to that shown by FIG. 17.

Referring to FIG. 18, programmable material 40 (not shown) within first local openings 56, 59 has been removed, for example by selective etching relative to materials 33, 38, and 37. An anisotropic etch may then be conducted of material 38 to expose conductive material 37 in the bottom of first openings 59.

Figure 19:
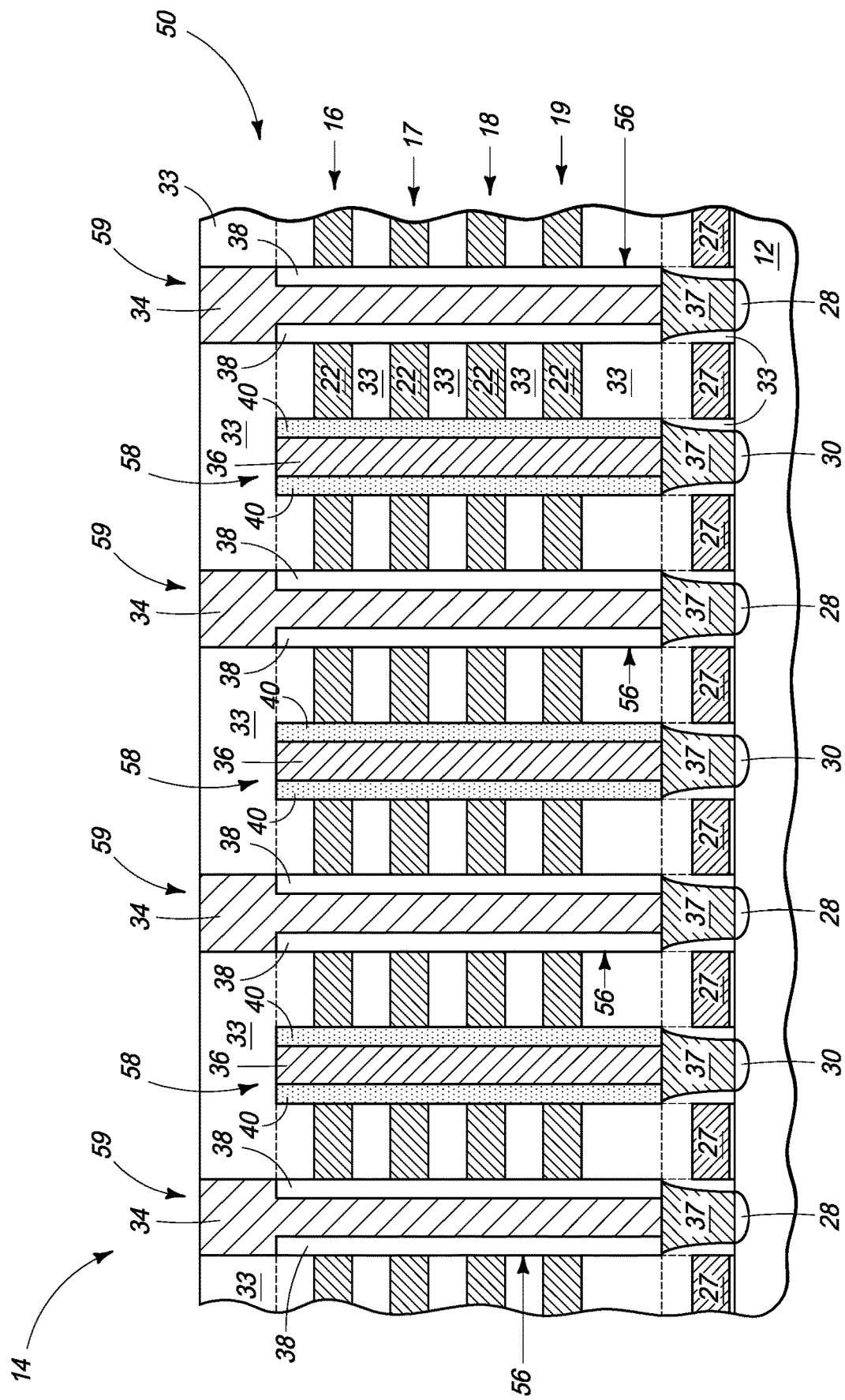
FIG. 19 is a view of the FIG. 18 substrate at a processing step subsequent to that shown by FIG. 18.

Referring to FIG. 19, conductive material 34 has been formed in first local openings 56 in conductive connection with individual of source/drain regions 28. Such provides but one example processing of replacing programmable material in first local openings 56, 59 with conductive material (i.e., material 34) in conductive connection with individual of source/drain regions 28. In one embodiment and as shown, such replacing removes all of programmable material 40 that was in first local openings 56, 59. Conductive material 34 within first local openings 56, 59 and conductive material 36 in second local openings 58 may be of the same or different composition(s).

Figure 20:
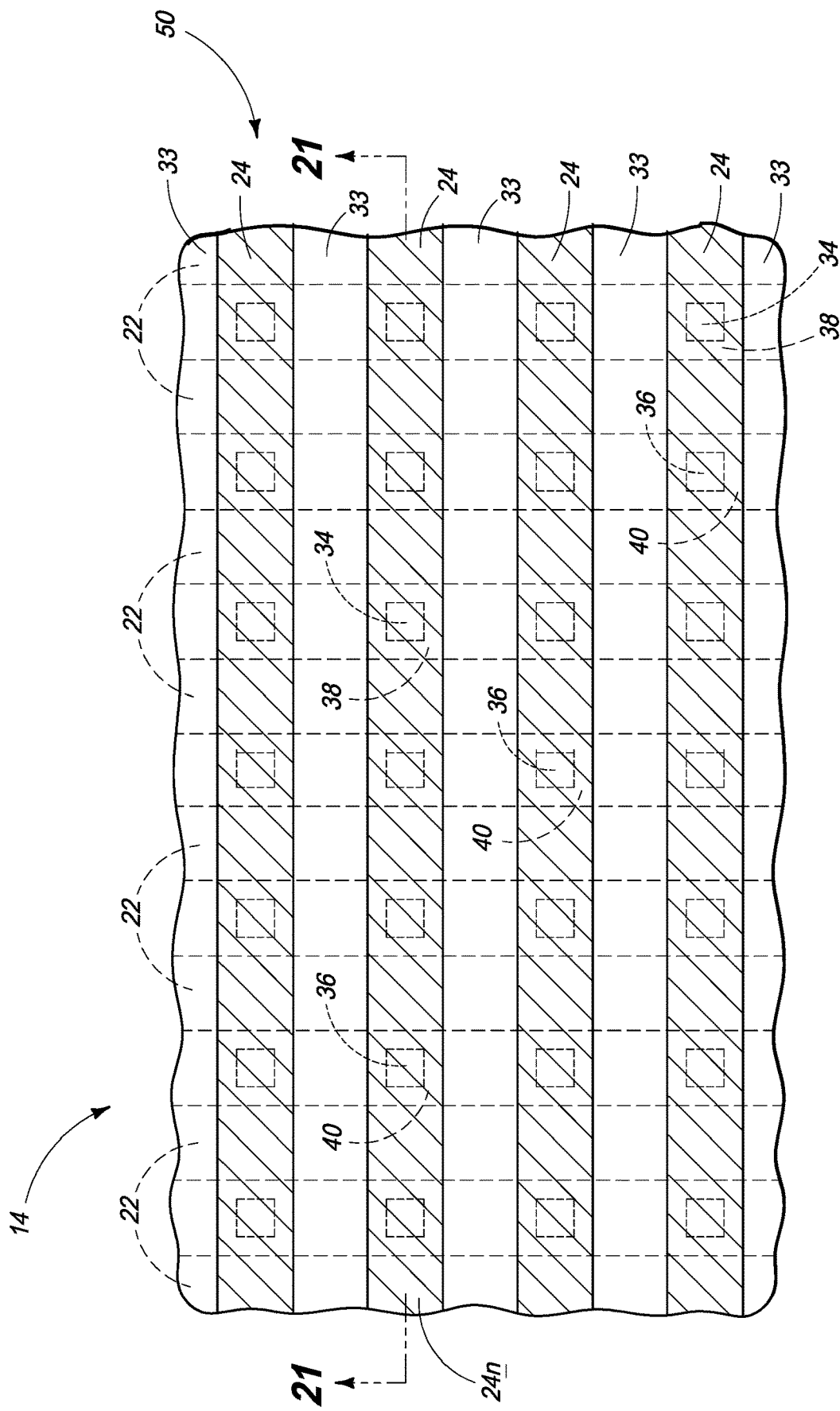
FIG. 20 is a top view of the substrate of FIG. 19 at a processing step subsequent to that shown by FIG. 19.
Figure 21:
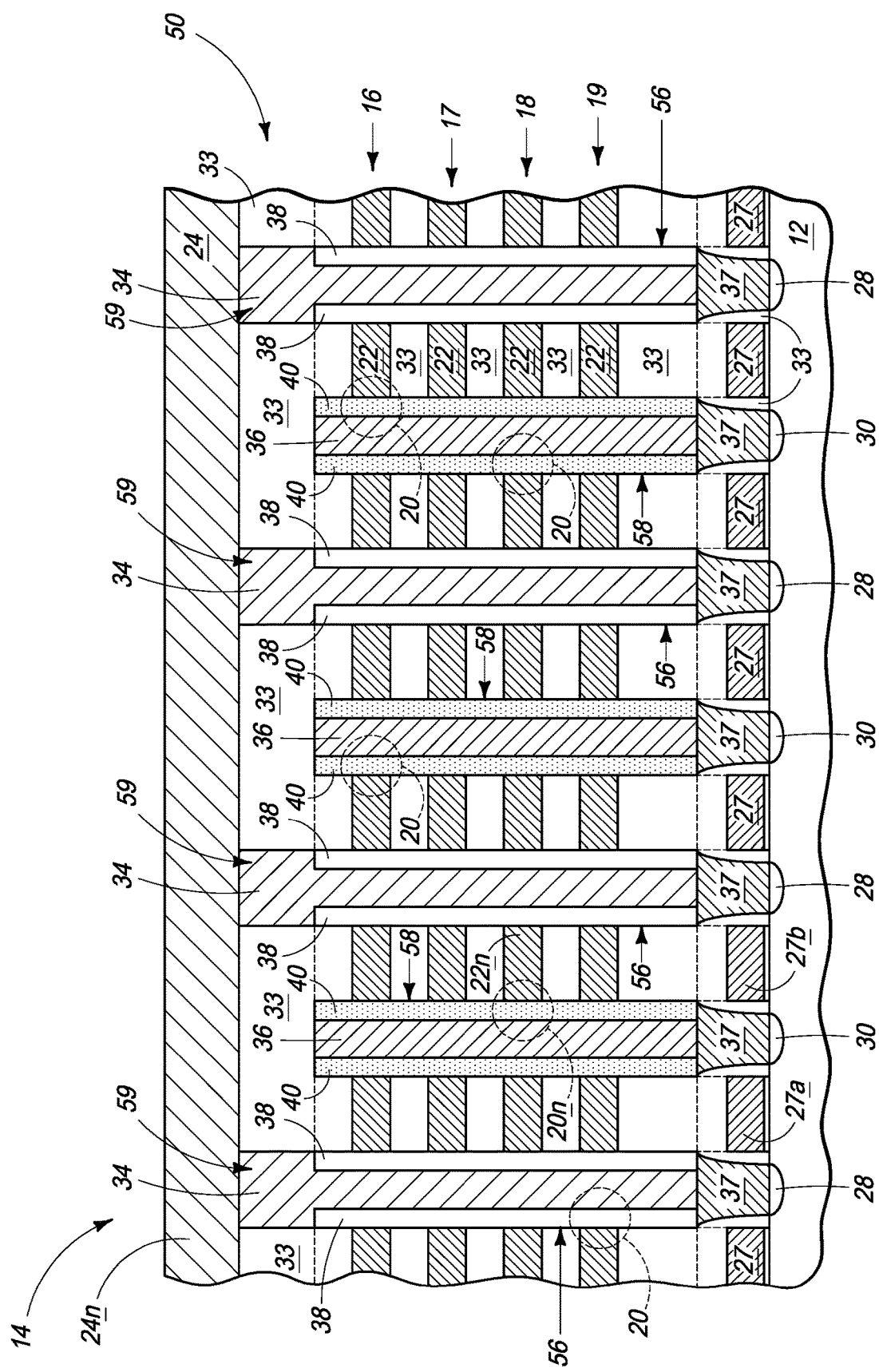
FIG. 21 is a cross sectional view taken through line 21-21 in FIG. 20.

Referring to FIGS. 20 and 21, a plurality of horizontally oriented global sense lines 24 have been provided elevationally outward of tiers 16-19 in conductive connection with conductive material 34 in first local openings 56, 59. Such may, by way of example only, be formed by deposition followed by patterning and subtractive etch. Material of global sense lines 24 and that of material 34 may be of the same or different composition(s). As an alternate example, lines 24 and conductive material 34 may comprise the same material deposited and formed in a damascene-like manner in the same deposition step(s). FIGS. 20 and 21 depict in one example an embodiment essentially the same as that depicted by FIGS. 1-3.

Embodiments of the invention encompass methods of forming an array of vertically stacked tiers of memory cells comprising forming multiple tiers that individually comprise a plurality of horizontally oriented access lines. A plurality of select transistors is provided elevationally inward of the tiers, with such individually comprising source/drain regions. In one embodiment, alternating first and second local openings are formed through the tiers between the access lines over individual of the source/drain regions in the same masking step. Conductive material is formed in the first local openings in conductive connection with alternating ones of the source/drain regions. Laterally outer programmable material and laterally inner conductive material are formed in the second local openings. The laterally inner conductive material is in conductive connection with alternating others of the source/drain regions. In one embodiment, the conductive material in the first local openings is formed after forming the laterally inner conductive material in the second local openings. In one embodiment, the conductive material in the first local openings is formed after forming the laterally outer programmable material in the second local openings.

In one embodiment, programmable material is formed in the first local openings. In one example, such programmable material is formed in the first and second local openings in the same deposition step. In one example, the programmable material is removed from the first local openings, and in one example before forming the conductive material in the first local openings. In one example, all of the programmable material is removed from the first local openings.

A plurality of horizontally oriented global sense lines is ultimately provided elevationally outward of the tiers in conductive connection with the conductive material in the first local openings.

Other attributes may be used as described and/or shown above.

In one embodiment of a method of forming an array of vertically stacked tiers of memory cells, alternating first and second local openings are formed through the tiers between the access lines over individual of the source/drain regions independent of whether such are formed in the same masking step. In one embodiment, such may be formed in the same masking step. Regardless, the first and second local openings are lined with dielectric material. The dielectric material that is lining the second local openings is replaced with a programmable material lining. Conductive material is formed in the first and second local openings in conductive connection with individual of the source/drain regions, with the programmable material in the second local openings being laterally between the current conductive material and the access lines. A plurality of horizontally oriented global sense lines are ultimately provided elevationally outward of the tiers in conductive connection with the conductive material in the first local openings. Other attributes as shown and/or described above may be used.

In one embodiment, a method of forming an array of vertically stacked tiers of memory cells forms alternating first and second local openings through the tiers between the access lines over individual of the source/drain regions independent of whether such occurs in the same masking step. In one embodiment, such does occur in the same masking step. Regardless, the first local openings are filled with programmable material and the second local openings are less-than-filled with programmable material regardless of whether such occurs in the same deposition step. In one embodiment, such occurs in the same deposition step. Conductive material is formed in the second local openings in conductive connection with individual of the source/drain regions. The programmable material in the second local openings is laterally between the current conductive material and the access lines.

The programmable material in the first local openings is replaced with current conductive material in conductive connection with individual of the source/drain regions. Ultimately, a plurality of horizontally oriented global sense lines is provided elevationally outward of the tiers in conductive connection with the conductive material in the first local openings. Other attributes as described and/or shown above may be used.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An array of vertically stacked tiers of memory cells, comprising:
    a plurality of horizontally oriented access lines within individual tiers of memory cells;
    a plurality of horizontally oriented global sense lines elevationally outward of the tiers of memory cells;
    a plurality of select transistors elevationally inward of the tiers of memory cells, individual of the select transistors comprising two source/drain regions;
    a plurality of pairs of local first and second vertical lines extending through the tiers of memory cells, the local first vertical line within individual of the pairs being in conductive connection with one of the global sense lines and in conductive connection with one of the two source/drain regions of one of the select transistors, the local second vertical line within individual of the pairs being in conductive connection with another of the two source/drain regions of the one select transistor;
    the local first vertical line being laterally lined with a dielectric material liner and the local second vertical line being laterally lined with a programmable material, the dielectric material having an upper surface elevationally equivalent with an upper surface of the programmable material; and
    individual of the memory cells comprising a crossing of the local second vertical lines and one of the horizontal access lines and the programmable material therebetween, the programmable material not being in physical contact with the another of the two source/drain regions, the programmable material comprising one or more members of the group consisting of oxide material having ions diffused therein, $Sr_xRu_yO_z$, $RuO_y$, $In_xSn_yO_z$, $BaTiO_3$, $Ba_{(1-x)}Sr_xTiO_3$, polymer material and memristive material.

2. The array of claim 1 wherein the local first vertical lines are taller than the local second vertical lines.

3. The array of claim 1, wherein the programmable material further comprises MgO.

4. The array of claim 1, wherein two of the select transistors comprised by the plurality of select transistors have respective gates that are wired in parallel to selectively enable current flow in each sense line.

5. The array of claim 4 wherein the respective gates are laterally spaced from one another by dielectric material and current conductive material.

6. The array of claim 4 wherein the gates are hard-wired together.

7. The array of claim 4 wherein the gates are soft-wired together.

8. The array of claim 4 wherein the two of the select transistors share a common source/drain region.

9. An array of vertically stacked tiers of memory cells, comprising:
    a plurality of horizontally oriented access lines within individual tiers of memory cells;
    a plurality of horizontally oriented global sense lines elevationally outward of the tiers of memory cells;
    a plurality of select transistors elevationally inward of the tiers of memory cells, individual of the select transistors comprising two source/drain regions;
    a plurality of pairs of local first and second vertical lines extending through the tiers of memory cells, the local first vertical line within individual of the pairs being in conductive connection with one of the global sense lines and in conductive connection with one of the two source/drain regions of one of the select transistors, the local second vertical line within individual of the pairs being in conductive connection with another of the two source/drain regions of the one select transistor;
    the local first vertical line being laterally lined with a dielectric material liner and the local second vertical line being laterally lined with a programmable material, the dielectric material having an upper surface elevationally equivalent with an upper surface of the programmable material; and
    individual of the memory cells comprising a crossing of the local second vertical lines and one of the horizontal access lines and the programmable material therebetween, the programmable material being in nonphysical contact with the another of the two source/drain regions.

* * * * *